(12) United States Patent
Cheng et al.

(10) Patent No.: US 11,121,051 B2
(45) Date of Patent: Sep. 14, 2021

(54) SEMICONDUCTOR PACKAGES AND METHOD OF MANUFACTURING THE SAME

(71) Applicant: Taiwan Semiconductor Manufacturing Co., Ltd., Hsinchu (TW)

(72) Inventors: Li-Hui Cheng, New Taipei (TW); Chin-Fu Kao, Taipei (TW); Szu-Wei Lu, Hsinchu (TW); Chih-Chien Pan, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/655,135

(22) Filed: Oct. 16, 2019

(65) Prior Publication Data

US 2021/0118758 A1    Apr. 22, 2021

(51) Int. Cl.
*H01L 23/31*    (2006.01)
*H01L 21/56*    (2006.01)
*H01L 23/00*    (2006.01)

(52) U.S. Cl.
CPC ........ *H01L 23/3185* (2013.01); *H01L 21/568* (2013.01); *H01L 24/20* (2013.01)

(58) Field of Classification Search
CPC ... H01L 21/568; H01L 23/3185; H01L 24/20; H01L 21/563; H01L 23/00; H01L 23/16; H01L 23/562; H01L 23/24; H01L 23/498; H01L 23/49816; H01L 23/49827; H01L 23/31; H01L 23/49838; H01L 23/49822; H01L 21/56; H01L 21/00
USPC ...................................................... 257/787
See application file for complete search history.

(56) References Cited

U.S. PATENT DOCUMENTS

| | | | |
|---|---|---|---|
| 2005/0287706 A1* | 12/2005 | Fuller | H01L 25/50 438/108 |
| 2006/0060987 A1* | 3/2006 | Chen | H01L 21/563 257/787 |
| 2008/0054490 A1* | 3/2008 | McLellan | H01L 21/563 257/778 |
| 2017/0287735 A1* | 10/2017 | Yao | H01L 23/3185 |

\* cited by examiner

*Primary Examiner* — Chuong A Luu
(74) *Attorney, Agent, or Firm* — JCIPRNET

(57) ABSTRACT

Semiconductor packages and methods of forming the same are disclosed. a semiconductor package includes a die and an underfill. The die is disposed over a surface and includes a first sidewall. The underfill encapsulates the die. The underfill includes a first underfill fillet on the first sidewall, and in a cross-sectional view, a second sidewall of the first underfill fillet has a turning point.

20 Claims, 30 Drawing Sheets

SEMICONDUCTOR PACKAGES AND METHOD OF MANUFACTURING THE SAME

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging. How to ensure the reliability of the wafer level packaging has become a challenge in the field.

DETAILED DESCRIPTION

Figure 1A:
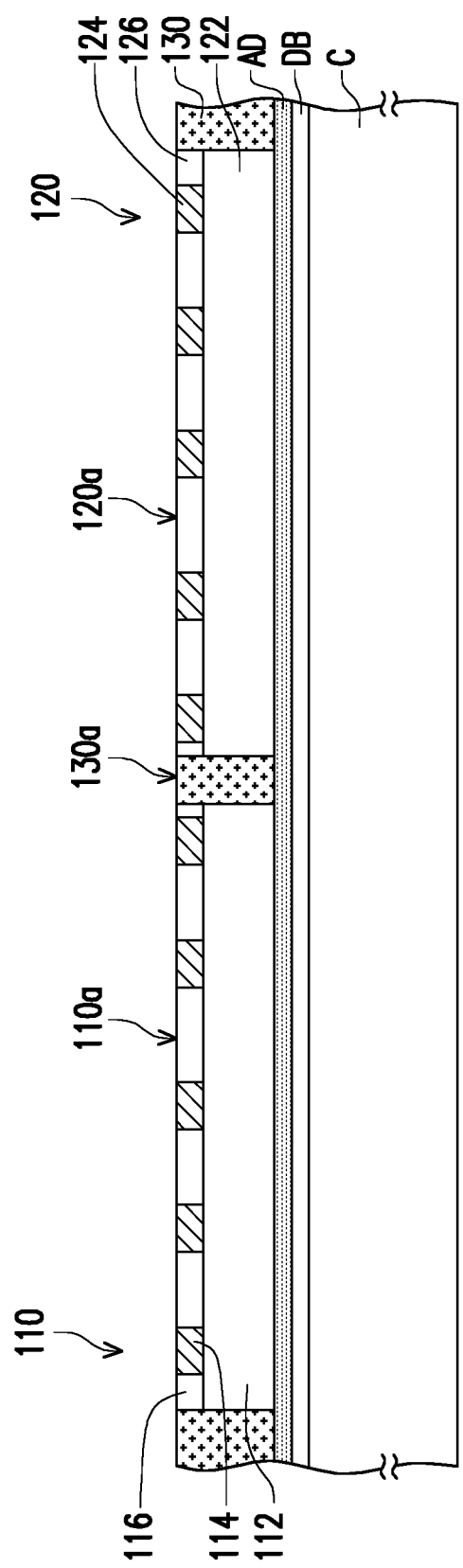
FIG. 1A to FIG. 1J are schematic cross-sectional views of various stages of manufacturing a semiconductor package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples of the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1J are schematic cross-sectional views of various stages of manufacturing a semiconductor package in accordance with some embodiments.

Referring to FIG. 1A, a plurality of semiconductor dies are disposed on a temporary carrier C. For example, after performing a singulation process to separate individual semiconductor dies from a semiconductor wafer (not shown), dies 110, 120 are picked and placed on the temporary carrier C. The temporary carrier C may be a glass carrier, a ceramic carrier, a metal carrier, or the like. After the dies 110, 120 are disposed side by side on the temporary carrier C, a gap is formed between the dies 110, 120. In some embodiments, the dies 110, 120 are attached onto the temporary carrier C through an adhesive layer AD. The adhesive layer AD may be a die attach film (DAF) or other suitable adhesive material. In some embodiments, a de-bonding layer DB is further formed between the temporary carrier C and the adhesive layer AD. In some embodiments, the de-bonding layer DB is formed of an adhesive such as Ultra-Violet (UV) glue, Light-to-Heat Conversion (LTHC) glue, or other types of adhesives. In some embodiments, the de-bonding layer DB is decomposable under the heat of light to release the temporary carrier C from the overlying structures that will be formed in subsequent steps. In some alternative embodiments, a buffer layer may be formed between the de-bonding layer DB and the temporary carrier C. The buffer layer may include a dielectric material layer made of a dielectric material including benzocyclobutene ("BCB"), polybenzooxazole ("PBO"), or any other suitable polymer-based dielectric material.

The die 110 may include a semiconductor substrate 112, conductive connectors 114 distributed on the semiconductor substrate 112, and a protection layer 116 disposed on the semiconductor substrate 112 and surrounding the conductive connectors 114 for protection. In some embodiments, the die 120 includes a similar or the same structure as the die 110. For example, the die 120 includes a semiconductor substrate 122, conductive connectors 124 distributed on the semiconductor substrate 122, and a protection layer 126 disposed on the semiconductor substrate 122 and surrounding the conductive connectors 124 for protection. In some embodiments, the conductive connectors 114/124 include conductive pillars, vias, bumps and/or posts made of solder, gold, copper, or any other suitable conductive materials. The conductive connectors 114/124 may be formed by an electroplating process or other suitable deposition process. The surface where the conductive connectors 114 are being distributed may be referred to as a front surface 110a (e.g., an active surface) of the die 110 for further electrical connection. Similarly, the surface where the conductive connectors 124 are being distributed may be referred to as a front surface 120a (e.g., an active surface) of the die 120 for further electrical connection. The front surface 120a of the die 120 faces the same direction as the front surface 110a of the die 110. In some embodiments, a material of the protection layer 116/126 includes polybenzoxazole, polyimide, a suitable organic or inorganic material, or the like.

The dies 110, 120 may be the same type of semiconductor dies or different types of semiconductor dies. In some embodiments, the die 110 and/or the die 120 may include active components (e.g., transistors or the like) and, optionally, passive components (e.g., resistors, capacitors, inductors, etc.) formed on the semiconductor substrate 112/122. The die 110 and/or the die 120 may be a logic die, such as a central processing unit (CPU) die, a graphic processing unit (GPU) die, a micro control unit (MCU) die, an input-output (I/O) die, a baseband (BB) die, or an application processor (AP) die. In some embodiments, at least one of the dies 110, 120 includes may be a memory die such as high bandwidth memory (HBM) die. In some embodiments, at least one of the dies 110, 120 may be a System-on-Die (SoC) die or a die stack. It should be appreciated that the number of the dies and the function of the dies to be packaged may depend on the design requirements.

With reference to FIG. 1A, an encapsulant 130 is formed over the temporary carrier C to encapsulate the dies 110, 120. The encapsulant 130 includes a molding compound (e.g., epoxy resins), a dielectric material such as polybenzoxazole, polyimide, benzocyclobutene, a combination thereof, or other suitable electrically insulating materials. In some embodiments, the method of forming the encapsulant 130 includes at least the following steps. An insulating material (not shown) is formed on the temporary carrier C, so that the dies 110, 120 are over-molded, and the gap between the dies 110, 120 is filled. Next, a thinning process is performed on the insulating material to reduce the thickness of the insulating material until at least a portion of the conductive connectors 114 of the die 110 and at least a portion of the conductive connectors 124 of the die 120 are accessibly revealed. The thinning process may include a grinding process, a chemical mechanical polishing (CMP) process, and/or a planarization process, or other suitable removing process. A cleaning step is optionally performed after thinning to clean and remove the residues generated from the thinning process. After reducing the thickness of the insulating material, the encapsulant 130 is formed. However, the formation of the encapsulant 130 may be performed through any other suitable techniques, the disclosure is not intended to limit to the above description. In some embodiments, during the thinning process, the protection layer 116 and/or the conductive connectors 114 of the die 110 and the protection layer 126 and/or the conductive connectors 124 of the die 120 may be slightly removed and planarized. The conductive connectors 114 of the die 110 and the conductive connectors 124 of the die 120 may be accessibly revealed by the protection layer 116 and 126, respectively. The protection layer 116 of the die 110 may at least laterally cover the conductive connectors 114. Similarly, the protection layer 126 of the die 120 may at least laterally cover the conductive connectors 124. In some embodiments, after forming the encapsulant 130, a surface 130a of the encapsulant 130 may be substantially coplanar with the front surface 110a of the die 110 and the front surface 120a of the die 120.

Figure 1B:
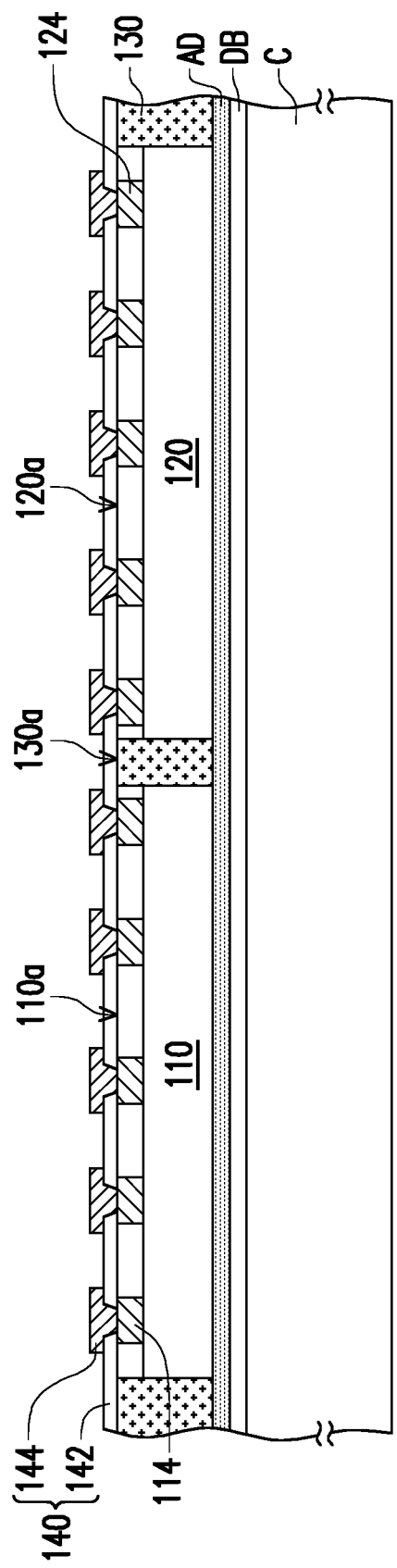

Referring to FIG. 1B, a redistribution structure 140 is formed on the surface 130a of the encapsulant 130, the front surface 110a of the die 110 and the front surface 120a of the die 120. The redistribution structure 140 includes, for example, a patterned dielectric layer 142 and a patterned conductive layer 144 in the patterned dielectric layer 142. In some embodiments, the method of forming the redistribution structure 140 includes at least the following steps. A dielectric material (e.g., polybenzoxazole, polyimide, benzocyclobutene, or other suitable material that is electrically insulating) is formed over the surface 130a of the encapsulant 130, the front surface 110a of the die 110, and the front surface 120a of the die 120 by using a spin-on process, a deposition process, or other suitable process. Next, a portion of the dielectric material is removed to form the patterned dielectric layer 142 having a plurality of openings by lithography and etching or other suitable removing process.

The openings of the patterned dielectric layer 142 expose at least a portion of the conductive connectors 114 of the die 110 and at least a portion of the conductive connectors 124 of the die 120. Subsequently, a conductive material (e.g., a metal or a metal alloy such as copper, silver, gold, tungsten, cobalt, aluminum, or alloys thereof) is formed over a surface of the patterned dielectric layer 142 and also formed inside the openings of the patterned dielectric layer 142. Then, the conductive material is patterned to form the patterned conductive layer 144 through patterning and metallization techniques (e.g., deposition of seed layer, lithography, plating, etching, etc.). Other suitable techniques may be utilized to form the redistribution structure 140. The patterned conductive layer 144 may include conductive lines, conductive vias, and conductive pads, etc. The patterned conductive layer 144 may penetrate through the patterned dielectric layer 142 so as to be in physical and electrical contact with the conductive connectors 114 of the die 110 and the conductive connectors 124 of the die 120. It is appreciated that the numbers of the patterned dielectric layers and the patterned conductive layers may depend on the circuit design and is not limited by the described embodiments.

It should be noted that although one layer of the patterned dielectric layer 142 and one layer of the patterned conductive layer 144 are illustrated in FIG. 1B, the number of these layers is not limited in the disclosure. In some alternative embodiments, the redistribution structure 140 may be constituted by more layers of the patterned dielectric layer 142 and the patterned conductive layer 144 depending on the design.

Figure 1C:
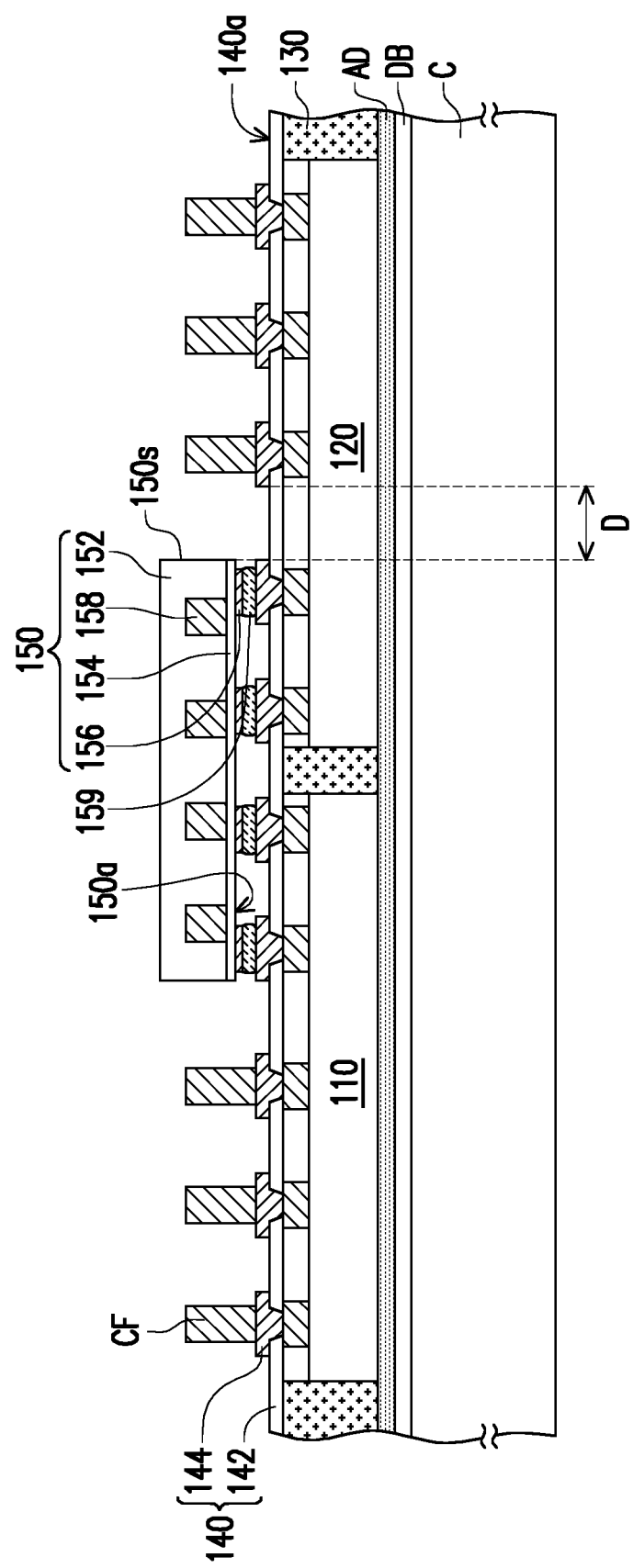

Referring to FIG. 1C, a plurality of conductive features CF are formed on a surface 140a of the redistribution structure 140. In some embodiments, the conductive features CF are formed on a top surface of the patterned conductive layer 144 of the redistribution structure 140 to electrically connect to the patterned conductive layer 144. In some embodiments, the conductive features CF may be referred to as conductive pillars. A material of the conductive features CF includes copper, nickel, solder, a combination thereof, or the like. In some embodiments, the method of forming the conductive features CF includes the following steps. A photoresist layer with openings (not shown) is formed on the redistribution structure 140, and the openings of the photoresist layer may expose the intended locations of the patterned conductive layer 144 for the subsequently formed conductive features CF. Subsequently, a plating process or other suitable deposition process is performed to form a metallic layer (e.g., a copper-containing layer) in the openings of the photoresist layer, and then the photoresist layer is removed. The conductive features CF are remained on the patterned conductive layer 144 of the redistribution structure 140. The conductive features CF may be electrically coupled to the dies 110, 120 through the redistribution structure 140. It is appreciated that the number and the location of the conductive features CF are variable and can be modified based on the design requirements.

With reference to FIG. 1C, a die 150 is disposed on the surface 140a of the redistribution structure 140. For example, after forming the conductive features CF, the die 150 is picked and placed on the redistribution structure 140. In some embodiments, the die 150 is surrounded by the conductive features CF. A distance D between the die 150 and the conductive feature CF may be substantially equal to a distance between the die 150 and a conductive pattern of the patterned conductive layer 144 below the conductive feature CF. The distance D is in a range of 5 µm to 2000 µm, for example. In some embodiments, the conductive features CF are formed prior to the placement of the die 150. However, the disclosure is not limited thereto. In some alternative embodiments, the die 150 may be placed before the conductive features CF are formed on the redistribution structure 140.

The die 150 may be the same type or the different type of semiconductor die with respective to the die 110 or the die 120. In some embodiments, the die 150 includes a semiconductor substrate 152, a device layer 154 disposed on the semiconductor substrate 152, and conductive connectors 156 connected to the device layer 154. In some embodiments, the die 150 includes through semiconductor vias (TSVs) 158. The TSVs 158 penetrate through the semiconductor substrate 152 so as to be in electrical contact with the device layer 154. The device layer 154 may include a wide variety of IC devices formed on the semiconductor substrate 152. The surface where the conductive connectors 156 are distributed may be referred to as a front surface 150a (e.g., active surface) of the die 150. In some embodiments, the die 150 is a bridge die (e.g., a silicon bridge die) for providing a shorter electrical connection path between the dies 110, 120. In some embodiments, the die 150 includes an interconnecting structure and free of active and/or passive device(s). In some alternative embodiments, the die 150 includes an interconnecting structure, active devices, and optionally, passive devices.

The die 150 may be disposed in a flip-die manner. For example, after disposing the die 150, the front surface 150a of the die 150 is connected to the patterned conductive layer 144 through a plurality of solder joints 159 and faces toward the front surface 110a of the die 110 and the front surface 120a of the die 120. In some embodiments, a solder paste (not shown) may be formed on the conductive connectors 156. Subsequently, the conductive connectors 156 having the solder paste formed thereon is attached to the topmost portion of the patterned conductive layer 144. Thereafter, a reflow process is performed to ensure the adhesion between the die 150 and the redistribution structure 140, thereby forming the solder joints 159 between the space from conductive connectors 156 and the topmost portion of the patterned conductive layer 144. After bonding the die 150 onto the patterned conductive layer 144, the die 110 and the die 120 are electrically connected by the die 150 through the patterned conductive layer 144, the solder joints 159, the conductive connectors 156 and the device layer 154.

Figure 1D:
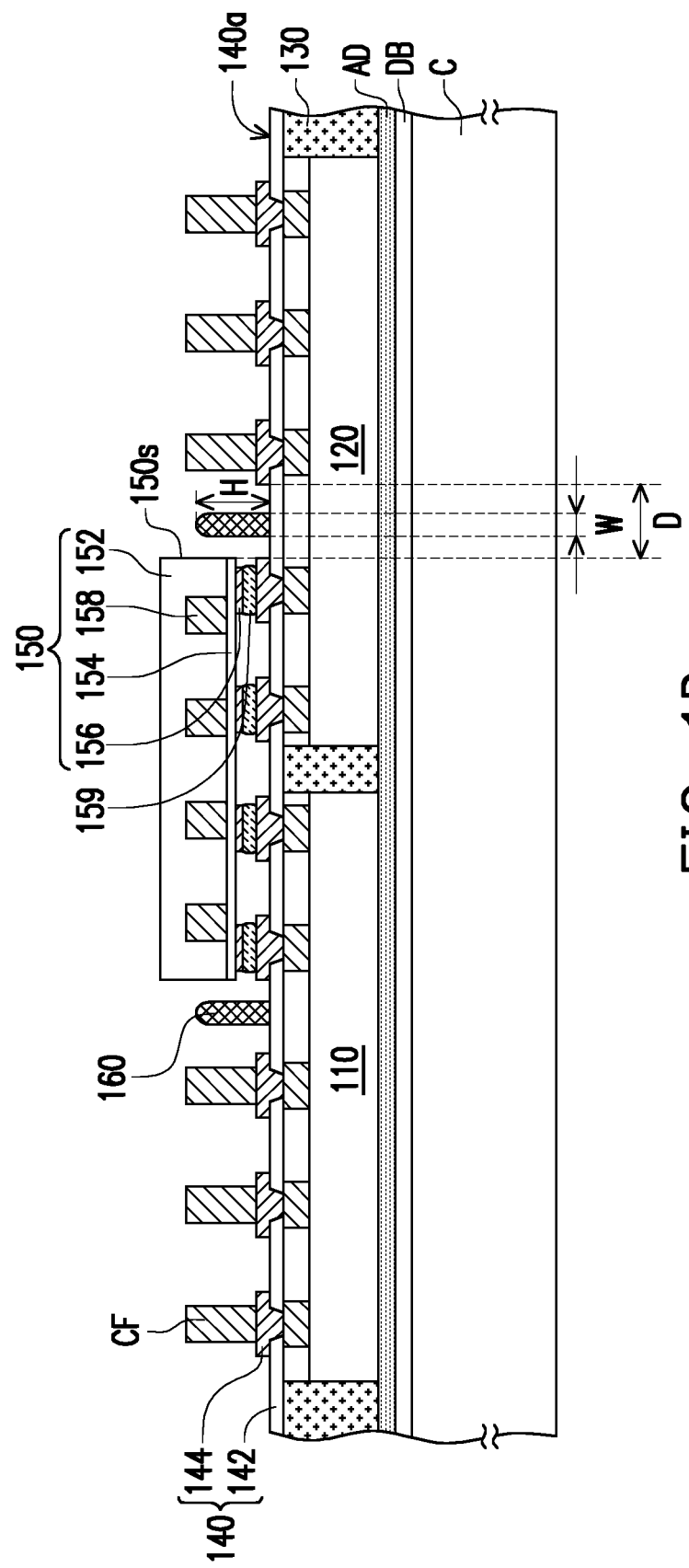
Figure 2B:
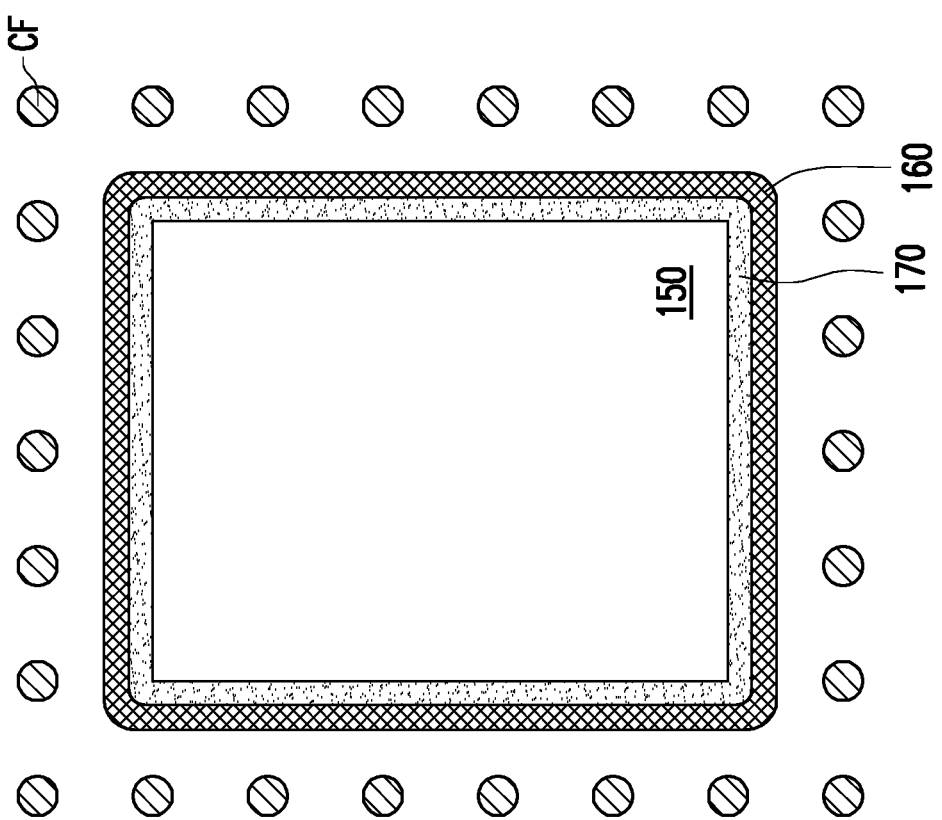
FIG. 2B is a schematic top view of FIG. 1E.
Figure 2A:
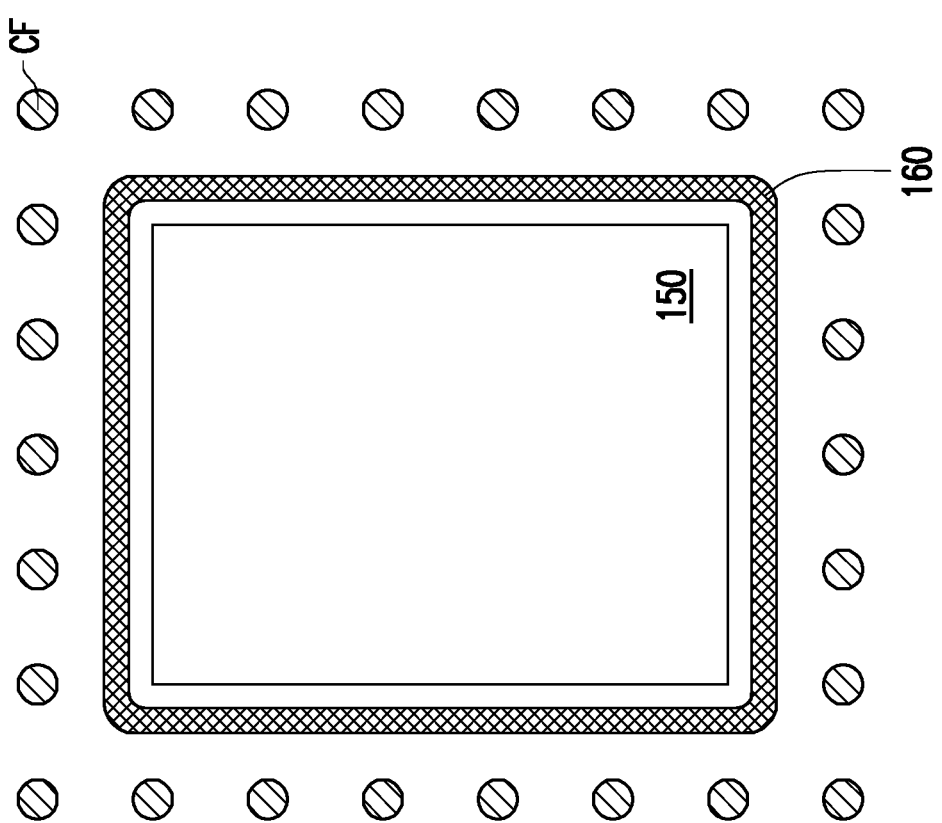
FIG. 2A is a schematic top view of FIG. 1D.

Referring to FIG. 1D and FIG. 2A which is a top view of FIG. 1D, a temporary underfill stopper 160 is formed on the redistribution structure 140 between the die 150 and the conductive features CF. The temporary underfill stopper 160 is continuously formed along at least one side of the die 150. In some embodiments, the temporary underfill stopper 160 is formed on the surface 140a of the patterned dielectric layer 142 without contacting with the patterned conductive layer 144. The temporary underfill stopper 160 is disposed between and separated from the conductive features CF and the die 150. The temporary underfill stopper 160 is not in contact with the conductive features CF and the die 150. A material of the temporary underfill stopper 160 includes an ultraviolet (UV) curable polymer such as acrylic based materials and epoxy base materials. The temporary underfill stopper 160 may have a thermal resistance in a range of 100° C. to 200° C. In some embodiments, the method of forming the temporary underfill stopper 160 includes the following steps. A UV curable material is dispensed on the surface 140a of the patterned dielectric layer 142 between the die 150 and the conductive features CF by an inkjet printer. Particularly, the UV curable material is dispensed along a box-shaped path (not shown) surrounding the area occupied by the die 150. Next, a curing process is performed on the UV curable material by providing a light having a UV wavelength or other appropriate heating method. In other words, the temporary underfill stopper 160 may be formed by dispensing UV curable material and curing the dispensed UV curable material. In some embodiments, the curing process may be performed on the UV curable material at a temperature of between about 50° C. and 250° C. for a period of time that falls between 10 minutes and 4 hours. However, any suitable temperature and duration may be employed during the curing step. In addition, the energy used for dispensing and the temperature of the curing process may be adjusted to form the temporary underfill stopper 160 with a desired cross-sectional shape, a height H, a width W or the like.

As shown in FIG. 2A, from a top view, the temporary underfill stopper 160 includes a box-shaped structure. The box-shaped structure is continuously disposed around the die 150 to surround the die 150. In some embodiments, inner sidewalls and outer sidewalls of the temporary underfill stopper 160 are substantially parallel to sidewalls 150s of the die 150, respectively. Thus, the width W of the temporary underfill stopper 160 is substantially constant. In some embodiments, the width W of the temporary underfill stopper 160 may be in a range of 50 μm to 1000 μm. As shown in FIG. 1D, a cross-sectional shape of the temporary underfill stopper 160 may be like a pillar having a curved top surface. The height H of the temporary underfill stopper 160 is smaller than a height of the die 150. In some embodiments, the height H may be in a range of 10 μm to 1000 μm. Although the temporary underfill stopper 160 illustrated in FIG. 1D has a pillar shape, the shape of the temporary underfill stopper is not limited in the disclosure.

Figure 1E:
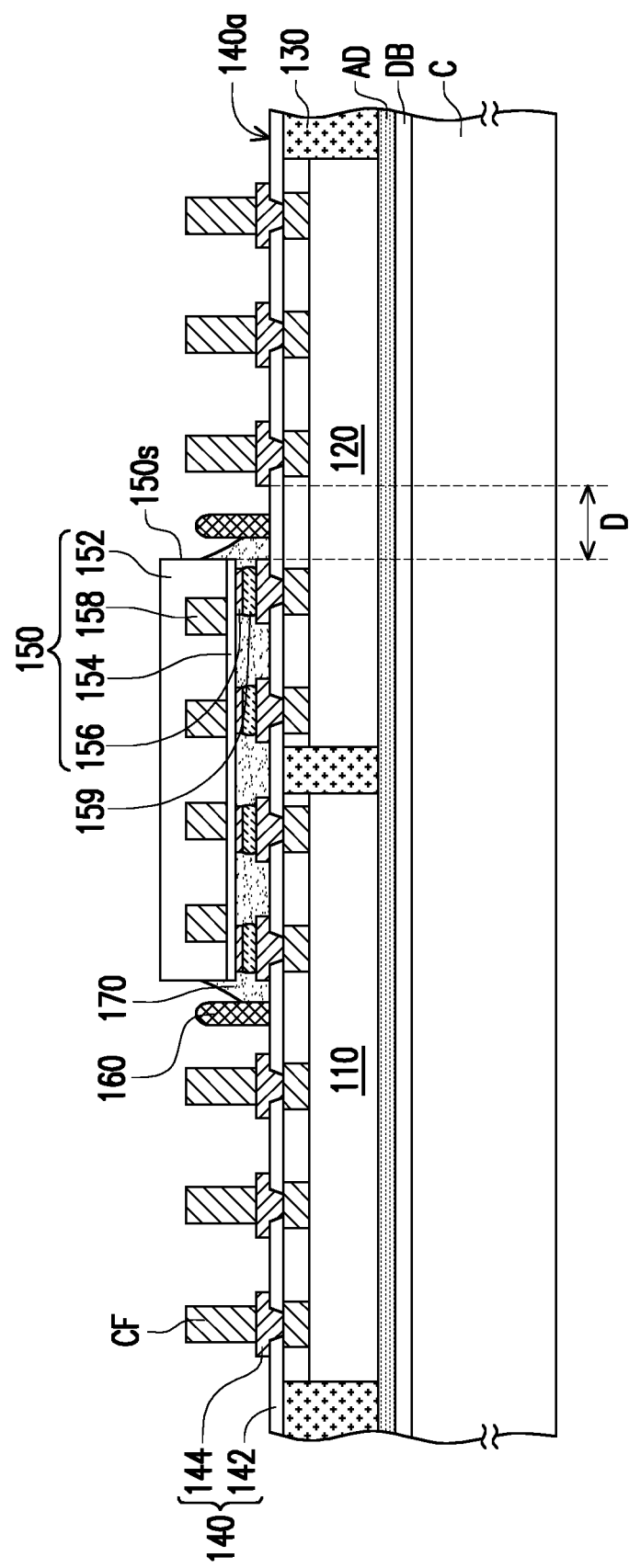

Referring to FIG. 1E and FIG. 2B which is a top view of FIG. 1E, after forming the temporary underfill stopper 160, an underfill 170 is formed among the temporary underfill stopper 160, the die 150 and the redistribution structure 140. In some embodiments, a material of the underfill 170 (e.g., epoxy mixture) is initially dispensed into gaps between the temporary underfill stopper 160 and the die 150 by using an underfill dispensing device (not shown). For example, the material of the underfill 170 is dispensed along only one side or two adjacent sides of the die 150 by a one sided or two-sided dispense process. The material of the underfill 170 may include a polymer (e.g., epoxy, polymide, polyamine, polynitrile, polyacrylate, oxazole polymer, and the like). The material of the underfill 170 may also include a filler material (e.g., oxide, nitride, carbide, or the like) in addition to the polymer. Then, the material of the underfill 170 flows between the die 150 and the redistribution structure 140 and fills the gaps among the temporary underfill stopper 160, the die 150 and the redistribution structure 140 by capillary action. Subsequently, the curing process is performed to harden the material of the underfill 170 so as to form the underfill 170. During the dispensing step of the underfill material, the temporary underfill stopper 160 with the sufficient height H acts as a barrier to keep the material of the underfill 170 within an area surrounded by the temporary underfill stopper 160. Thus, the underfill 170 is prevented from touching and bleeding to the conductive features CF. Accordingly, cracks and broken connections of the conductive features CF may be prevented during subsequent thermal processes. In addition, the underfill 170 may cover (or laterally surround) the conductive connectors 156 of the die 150, the solder joints 159 and the patterned conductive layer 144 of the redistribution structure 140, and thereby strengthening the connection therebetween and preventing the thermal stresses from breaking the connection therebetween.

Figure 1F:
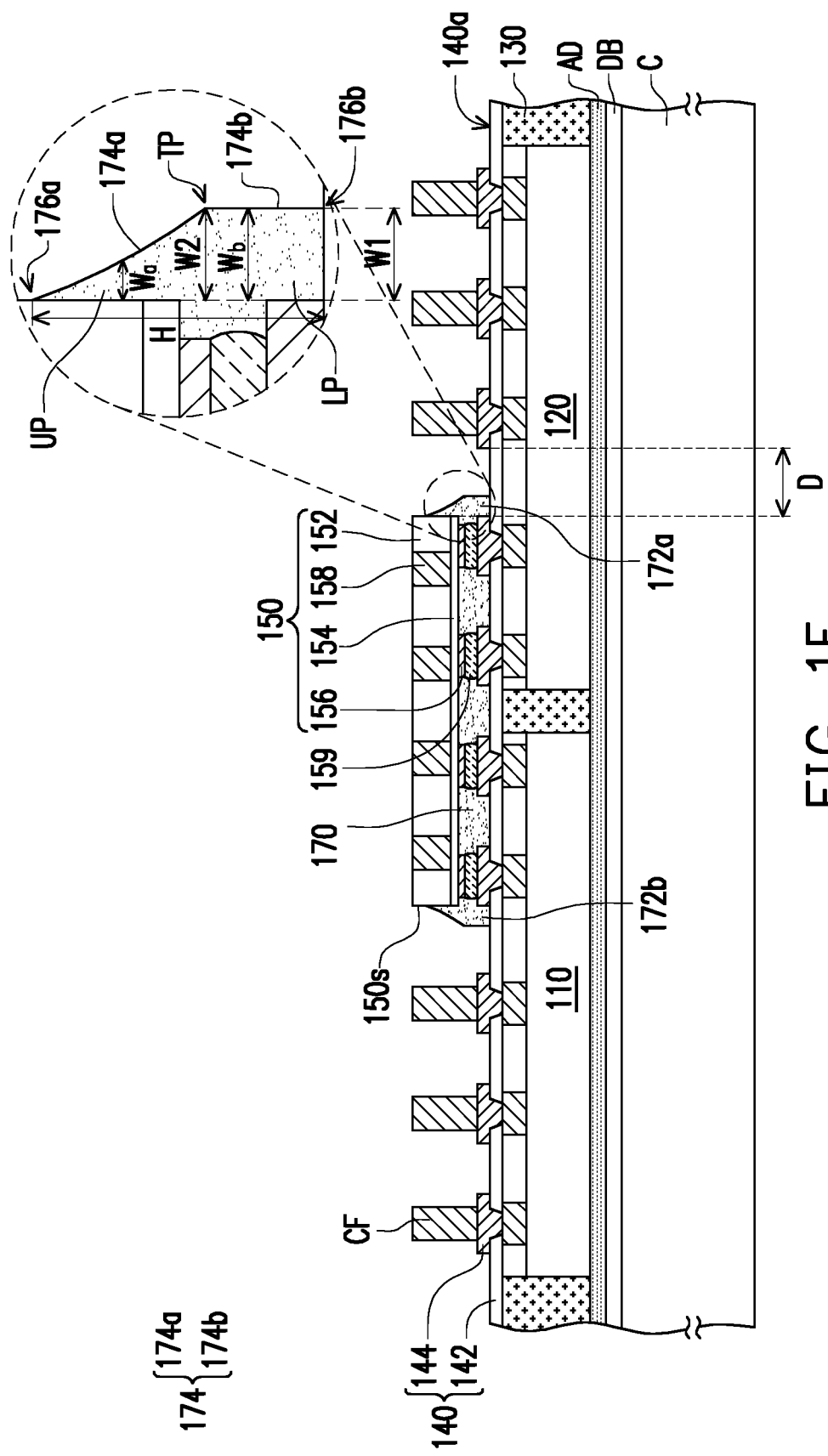

Referring to FIG. 1F, the temporary underfill stopper 160 is removed after forming the underfill 170. In some embodiments, the temporary underfill stopper 160 may be removed by a wet or dry cleaning process or other suitable removal process. The wet cleaning process may be performed with a cleaning reagent such as water, tetramethylammonium hydroxide (TMAH), and OH based solutions, and the dry cleaning process may be performed with O2-based plasma, Ar-based plasma, CF4-based plasma, N2-based plasma, a combination thereof or the like.

During the formation, a portion of the underfill 170 is in contact with the temporary underfill stopper 160, and thus a shape of the underfill 170 may be partially defined by the temporary underfill stopper 160. In some embodiments, when the temporary underfill stopper 160 has a pillar shape, the underfill 170 may have a geometric shape, where a sidewall 174 at one side of the underfill 170 has a turning point TP connecting two different portions of the sidewall 174 when viewing from a cross-sectional view of the underfill 170. In the embodiments, the above geometric shape may be referred to as a house-like shape. The underfill 170 encapsulates a portion of the sidewall 150s of the die 150 and partially exposes a portion of the sidewall 150s (i.e., a top portion of the sidewall 150s) of the die 150. In some embodiments, the underfill 170 includes a plurality of underfill fillets (e.g., underfill fillets 172a, 172b) between the sidewalls 150s of the die 150 and the conductive features CF. The underfill fillet 172a, 172b is formed on the sidewall 150s at each side of the die 150 and extends over the surface 140a of the redistribution structure 140 between the sidewalls 150s of the die 150 and the conductive features CF. The sidewall 174 (i.e., an outer sidewall) of the underfill fillet 172a, 172b has an endpoint 176a on the sidewall 150s of the die 150, an endpoint 176b on the surface 140a of the redistribution structure 140 and a turning point TP between the endpoints 176a, 176b. In other words, the sidewall 174 includes a first sidewall 174a extending between the endpoint 176a and the turning point TP and a second sidewall 174b extending between the turning point TP and the endpoint 176b. Accordingly, the underfill fillet 172a, 172b may be divided into a first portion UP having the first sidewall 174a and a second portion LP having the second sidewall 174b. The second portion LP is disposed between the redistribution structure 140 and the first portion UP. In some embodiments, the first sidewall 174a of the first portion UP is smooth, substantially linear without a turning point, and the first portion UP has a triangle shape. In some embodiments, a width Wa of the first portion UP (i.e., the shortest width between the sidewall 150s and the first sidewall 174a or the shortest width between an extending line of the sidewall 150s and the first sidewall 174a) increases as the first portion UP becomes closer to the turning point TP. In some embodiments, the second sidewall 174b is substantially parallel to the sidewall 150s of the die 150, and the second portion LP has a rectangle shape. In some embodiments, a width Wb of the second portion LP (i.e., the shortest width between the sidewall 150s and the second sidewall 174b or the shortest width between the extending line of the sidewall 150s and the second sidewall 174b) remains substantially the same as the first portion UP becomes closer to the surface 140a. In some embodiments, since a sidewall of the temporary underfill stopper 160 may not be smooth, the second sidewall 174b of the second portion LP may have a wave-like surface from a microscopic point of view.

In some embodiments, the underfill fillet 172a, 172b has a width W1 measuring from the extending line of the sidewall 150s to the endpoint 176b, and a width W2 measuring from the sidewall 150s of the die 150 (or the extending line of the sidewall 150s of the die 150) to the turning point TP. The width W1 is also referred to as a bottom width of the second portion LP, and the width W2 is also referred to as a bottom width of the first portion UP. In some embodiments, the width W2 is substantially equal to the width W1, and the width W1, W2 is also the largest width of the underfill fillet 172a, 172b. In some embodiments, the width W1, W2 may be in a range of 5 μm to 1800 μm. The width W1 and the width W2 of the underfill fillet 172a, 172b are both smaller than the distance D between the die 150 and the conductive feature CF. Therefore, the underfill fillet 172a, 172b is prevented from being in contact with the conductive feature CF. In some embodiments, the underfill fillet 172a, 172b has a height H measuring from the surface 140a of the redistribution structure 140 to the endpoint 176a. The height H of the underfill fillet 172a is substantially the same as the height H of the underfill fillet 172b, for example. In some embodiments, the underfill fillets (e.g., underfill fillets 172a, 172b) on different sidewalls 150s of the die 150 are formed by partially contacting with the temporary underfill stopper 160, and thus the underfill fillets have similar or substantially the same shape, height, width or the like. However, the disclosure is not limited thereto. In some alternative embodiments, the underfill fillets on different sidewalls of the die may have different shapes, height, width or the like.

Figure 1G:
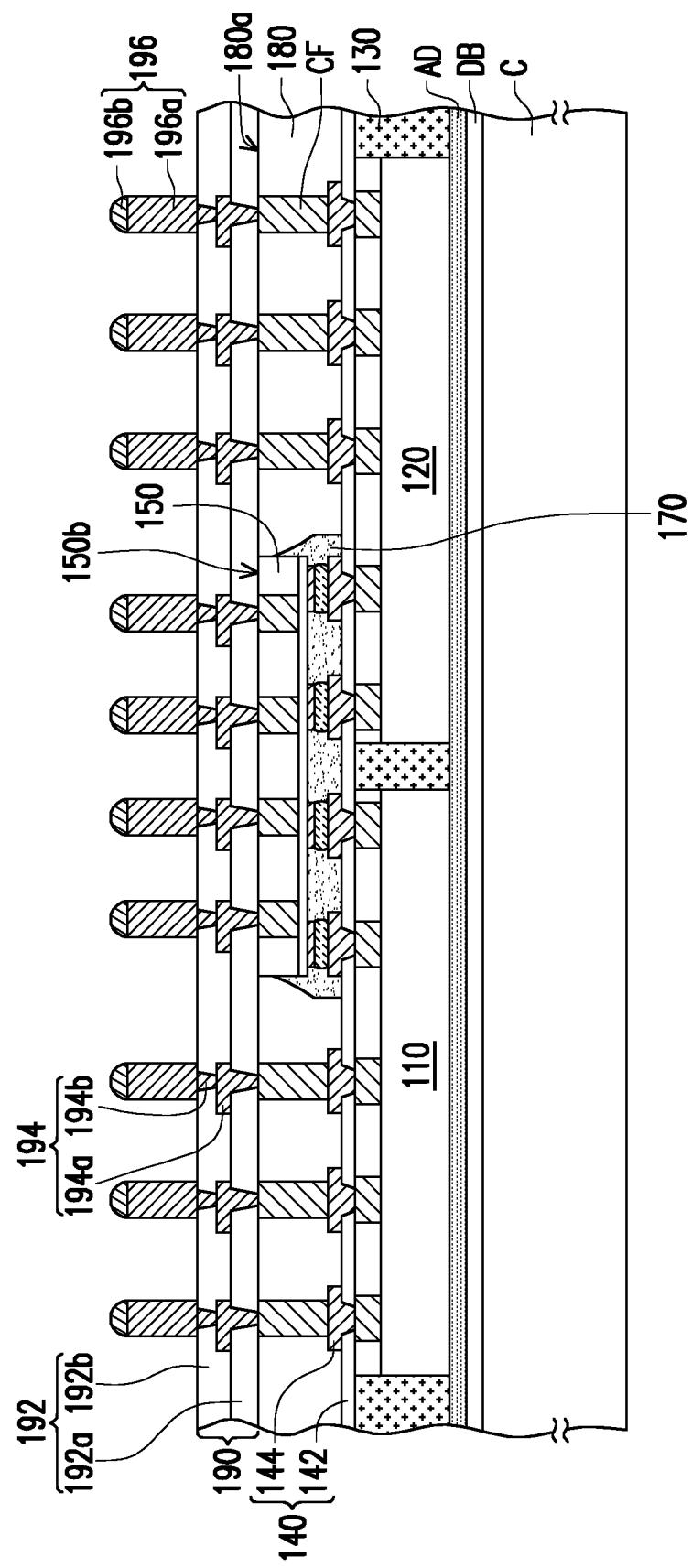

Referring to FIG. 1G, an encapsulant 180 is then formed on the redistribution structure 140 to encapsulate the conductive features CF, the die 150, and the underfill 170. The forming process and the material of the encapsulant 180 may be similar to that of the encapsulant 130, and thus, details thereof are simplified for brevity. In some embodiments, the conductive features CF, the die 150, and the underfill 170 are initially over-molded by an insulating material. Next, a thinning process is performed to reduce the thickness of the insulating material until at least a portion of the conductive features CF is exposed so as to form the encapsulant 180. In some embodiments, during the thinning process, the conductive features CF and/or the die 150 are slightly removed. In certain embodiments, the die 150 is grinded until the TSVs 158 are exposed. After forming the encapsulant 180, a surface 180a of the encapsulant 180 may be substantially coplanar with a rear surface 150b (e.g., opposite to the front surface 150a) of the die 150 and top surfaces of the conductive features CF. In some embodiments, the conductive features CF penetrate the encapsulant 180, and thus the conductive features CF may be also referred to as through mold vias (TMVs).

After the above process, a redistribution structure 190 is formed on the surface 180a of the encapsulant 180, the rear surface 150b of the die 150, and the top surfaces of the conductive features CF. The redistribution structure 190 is in physical and electrical contact with the conductive features CF. In some embodiments, the redistribution structure 190 is in physical and electrical contact with the TSVs 158 of the die 150. The redistribution structure 190 may include a patterned dielectric layer 192 and a patterned conductive layer 194. In some embodiments, a plurality of polymer sublayers (e.g., polymer sublayers 192a, 192b) and a plurality of metallic sublayers (e.g., metallic sublayers 194a, 194b) are stacked alternately to form the redistribution structure 190. The numbers of the polymer sublayers and the metallic sublayers are not limited in the disclosure. In some embodiments, the polymer sublayers 192a and 192b are made of the same material, and the polymer sublayers 192a and 192b may be collectively viewed as the patterned dielectric layer 192. The metallic sublayers 194a and 194b may be collectively viewed as the patterned conductive layer 194.

In the embodiments, the redistribution structure 190 may be formed as followings. First, the polymer sublayer 192a having a plurality of openings is formed over the surface 180a of the encapsulant 180, the rear surface 150b of the die 150, and the top surfaces of the conductive features CF. The openings of the polymer sublayer 192a may expose at least a portion of the conductive features CF and/or at least a portion of the TSVs 158 of the die 150. Next, a conductive material is formed and patterned to form the metallic sublayer 194a on the surface of the polymer sublayer 192a and inside the openings of the polymer sublayer 192a so as to be in physical and electrical contact with the conductive features CF and/or the TSVs 158 of the die 150. Subsequently, the polymer sublayer 192b is formed on the polymer sublayer 192a to cover the metallic sublayer 194a. The polymer sublayer 192b may have a plurality of openings exposing at least a portion of the metallic sublayer 194a. Afterwards, the metallic sublayer 194b is formed and patterned on the polymer sublayer 192b and inside the openings of the polymer sublayer 192b so as to be in physical and electrical contact with the underlying metallic sublayer 194a. In some embodiments, the metallic sublayer 194b includes connecting pads or under-ball metallurgy (UBM) pattern (not shown) for further electrical connection. It is appreciated that the numbers of the polymer sublayers and the metallic sublayers may depend on the circuit design, which are not limited in the disclosure.

After the formation of the redistribution structure 190, a plurality of conductive terminals 196 may be formed thereon. For example, each conductive terminal 196 includes a first portion 196a and a second portion 196b. The first portion 196a is formed on the metallic sublayer 194b of the redistribution structure 190, and the second portion 196b is formed on the first portion 196a. In some embodiments, the first portion 196a and the second portion 196b are made of different materials. For example, the first portion 196a is substantially a conductive material layer including pure elemental copper, copper containing unavoidable impurities, or copper alloys containing minor amounts of elements such as tantalum, indium, tin, zinc, titanium, germanium, platinum, aluminum, etc. The second portion 196b may include solder material including alloys of tin, lead, silver, copper, nickel, bismuth, or combinations thereof. In some embodiments, the conductive terminals 196 may be arranged in an array. For example, the conductive terminals 196 include controlled collapse die connection (C4) bumps, microbumps, conductive pillars, electroless nickel-electroless palladium-immersion gold technique (ENEPIG) formed bumps, combination thereof (e.g., a metal pillar having a solder cap attached thereof), or the like.

Figure 1H:
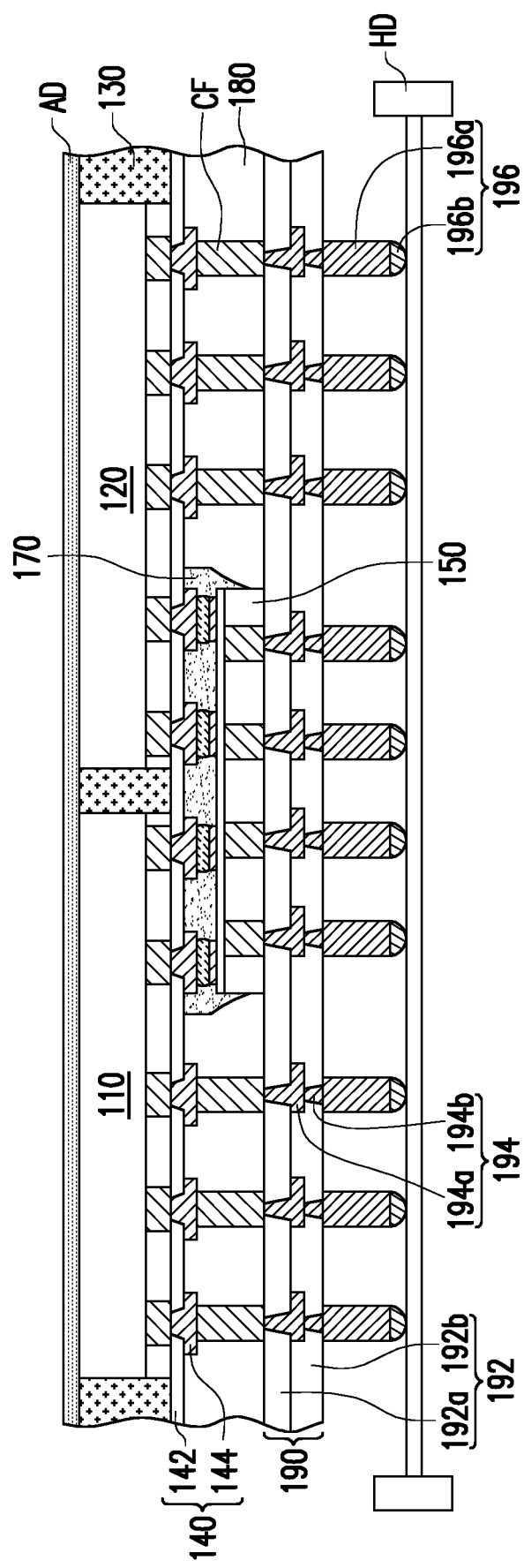

Referring to FIG. 1H, the temporary carrier C is detached and removed from the overlying structure. In some embodiments, the structure shown in FIG. 1H is overturned (e.g., turned upside down) and placed on a holder HD such as a frame tape for the de-bonding process of the temporary carrier C. For example, the de-bonding layer DB (e.g., LTHC release layer) is irradiated with a UV laser, so that the temporary carrier C and the de-bonding layer DB are easily peeled off from the underlying structure. Nevertheless, the de-bonding process is not limited thereto, and other suitable de-bonding methods may be used in some alternative embodiments.

Figure 1I:
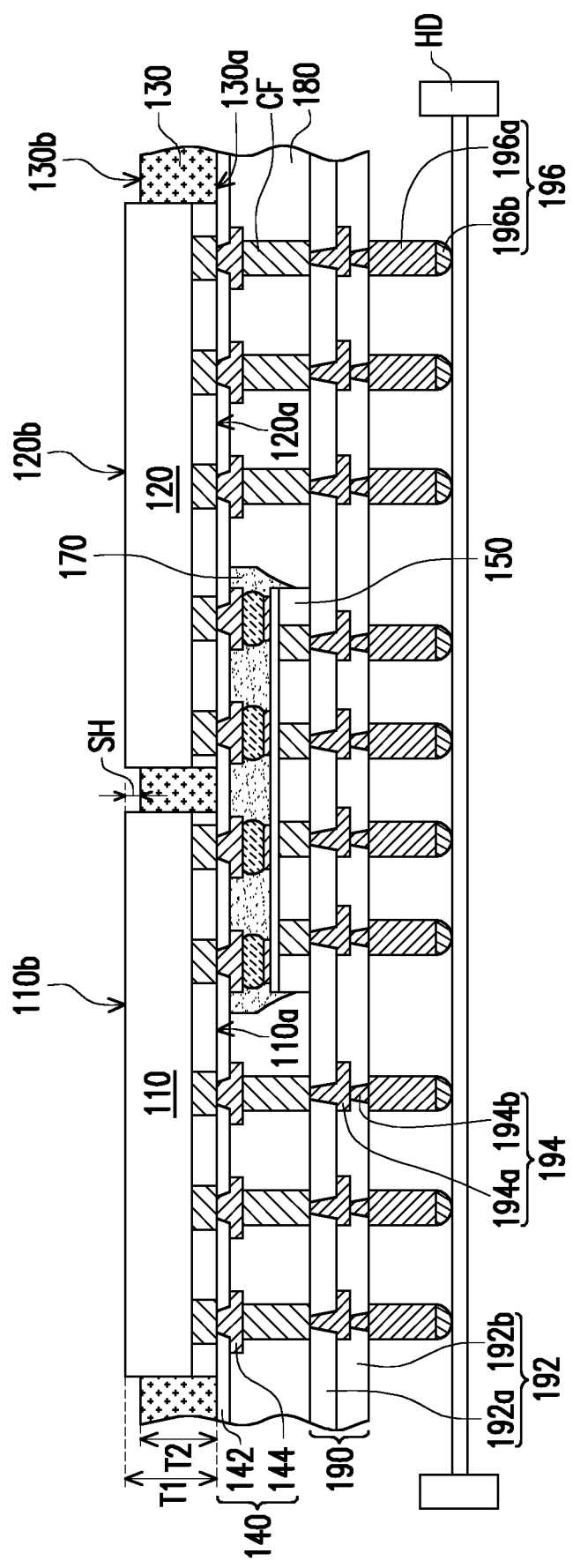

Referring to FIG. 1I, after removing the temporary carrier C, the adhesive layer AD is removed from the package structure 100. In some embodiments, a dry cleaning process is performed to remove the adhesive layer AD. The dry cleaning process may uses O2-based plasma, Ar-based plasma, CF4-based plasma, N2-based plasma, a combination thereof or other suitable plasma. In some embodiments, during the removal process of the adhesive layer AD, a portion of the encapsulant 130, which is exposed after removing the adhesive layer AD, may be partially removed. Thus, a surface 130b (e.g., opposite to the surface 130a) of the encapsulant 130 is lower than a rear surface 110b (e.g., opposite to the front surface 110a) of the die 110 and a rear surface 120b (e.g., opposite to the front surface 120a) of the die 120. In other words, the surface 130b of the encapsulant 130 is recessed with respect to the rear surfaces 110b, 120b of the dies 110, 120. A step height SH is formed between the encapsulant 130 and the die 110 and between the encapsulant 130 and the die 120. The step height SH is in a range of 2 µm to 50 µm, for example. In some embodiments, after removing the adhesive layer AD, a total thickness T1 of the semiconductor substrate 112 and the protection layer 116 of the die 110 is larger than a thickness T2 of the encapsulant 130. Similarly, a total thickness T1 of the semiconductor substrate 122 and the protection layer 126 of the die 120 is larger than a thickness T2 of the encapsulant 130. In one embodiment, the thickness T1 is in a range of 100 µm to 700 µm. However, the disclosure is not limited thereto, in some alternative embodiments, the adhesive layer AD may be removed by other suitable process, and the surface 130b of the encapsulant 130 is substantially-equal to flush with the rear surface 110b of the die 110 and the rear surface 120b of the die 120.

Conventionally, when the adhesive layer (e.g., DAF) is removed by a wet cleaning process using chemical solutions, the chemical solutions may easily damage the conductive terminals such as C4 bumps by diffusing into the gaps between the package structure and the holder and then penetrating sidewalls of the conductive terminals. On contrary, the embodiments uses the dry cleaning process for preventing the conductive terminals 196 from being damaged. In an embodiment, it is observed that the surfaces of the conductive terminals 196 are smooth and clear. In other words, the conductive terminals 196 are not damaged by the cleaning reagent for removing the adhesive layer AD.

Figure 1J:
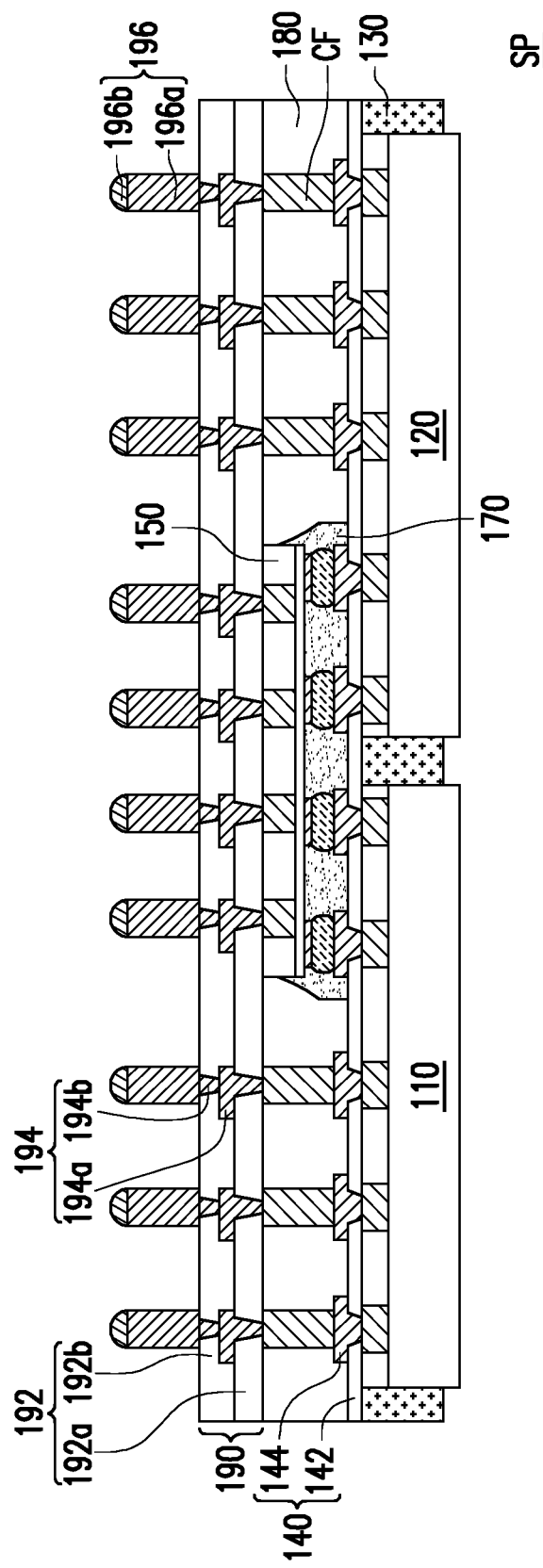

After removing the adhesive layer AD, a singulation process is performed to form a plurality of semiconductor packages SP of FIG. 1J. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, the semiconductor package SP may be referred to as an integrated fan-out (InFO) package. However, the disclosure is not limited thereto. In some alternative embodiments, the semiconductor package SP may be other types of packages.

In some embodiments, through the usage of the temporary underfill stopper, the bleeding and damage of the underfill to the conductive features such as TMVs may be prevented. Accordingly, the process window for underfill dispensing process is enlarged, and the distance between the die such as bridge die and the conductive features such as TMVs may be reduced. As such, the size of the semiconductor package may be further reduced. Moreover, the adhesive layer may be removed by the dry cleaning process, the damage to the conductive terminals may be prevented. Based on the above, and the product yield may be improved.

FIG. 3A to FIG. 3F are schematic cross-sectional views of various stages of manufacturing a semiconductor package in accordance with some embodiments. The method of FIGS. 3A to 3F is similar to the method of FIGS. 1A to 1I, hence the same reference numerals are used to refer to the same and liked parts, and its detailed description will be omitted herein. The main difference is described as follows.

Figure 3A:
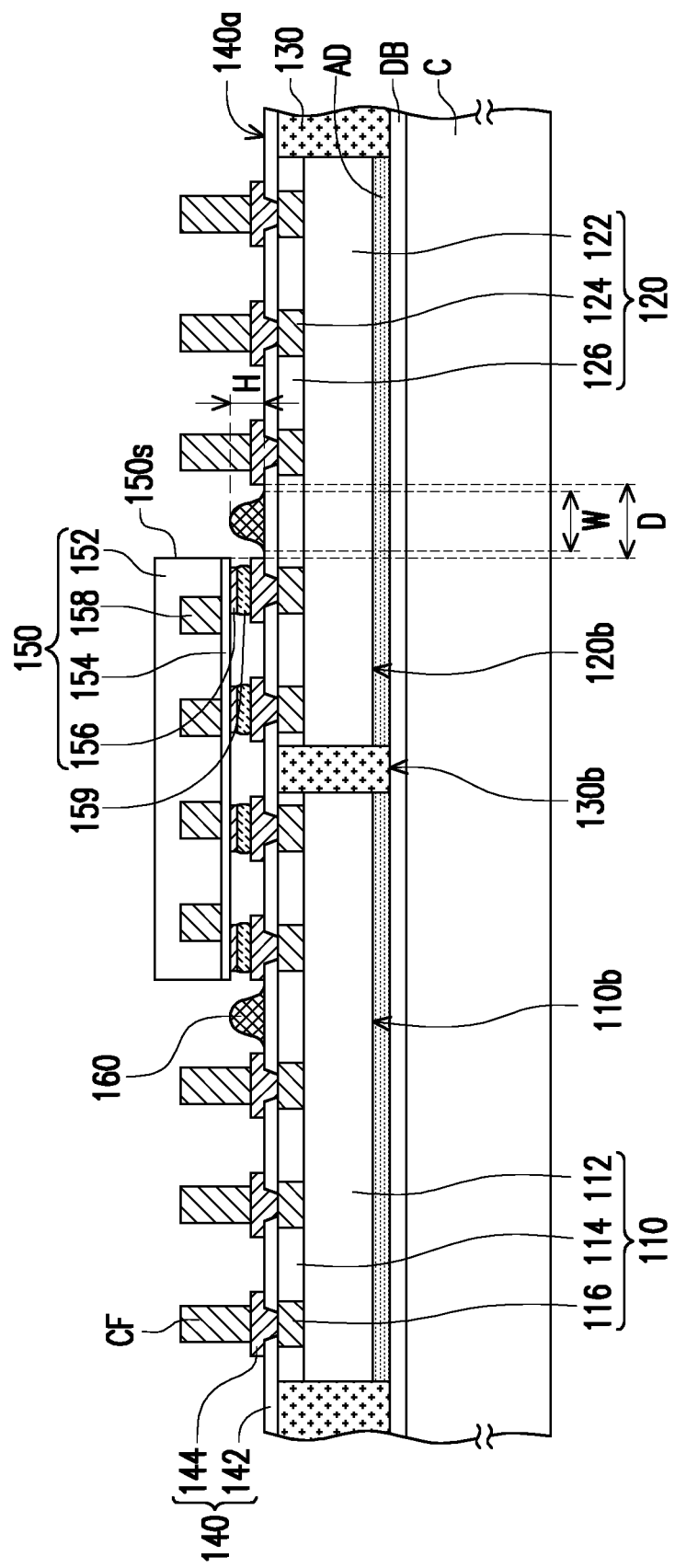
FIG. 3A to FIG. 3F are schematic cross-sectional views of various stages of manufacturing a semiconductor package in accordance with some embodiments.

Referring to FIG. 3A, a structure is formed on a temporary carrier C having a de-bonding layer DB thereon. The structure is similar to the structure of FIG. 1C, and the difference lies in the adhesive layers AD are respectively formed beneath the dies 110, 120 without extending onto the temporary carrier C. Thus, as shown in FIG. 3A, rear surfaces 110b, 120b of the dies 110, 120 are not flush with the surface 130b of the encapsulant 130, and surfaces of the adhesive layers AD are substantially flush with the surface 130b of the encapsulant 130.

Then, a temporary underfill stopper 160 is formed on a surface 140a of the redistribution structure 140 between the die 150 and the conductive features CF. In some embodiments, the temporary underfill stopper 160 may have a box shape surrounding the die 150 when viewed from a top view. With reference to FIG. 3A, a cross-sectional shape of the temporary underfill stopper 160 may have a hill shape, where a width W of the temporary underfill stopper 160 increases as the temporary underfill stopper 160 becomes closer to the surface 140a of the redistribution structure 140. In some embodiments, the width W of the temporary underfill stopper 160 is in a range of 50 μm to 1000 μm. A height H of the temporary underfill stopper 160 is smaller than a height of the die 150. In some embodiments, the height H may be in a range of 10 μm to 1000 μm as shown in FIG. 3A.

Figure 3B:
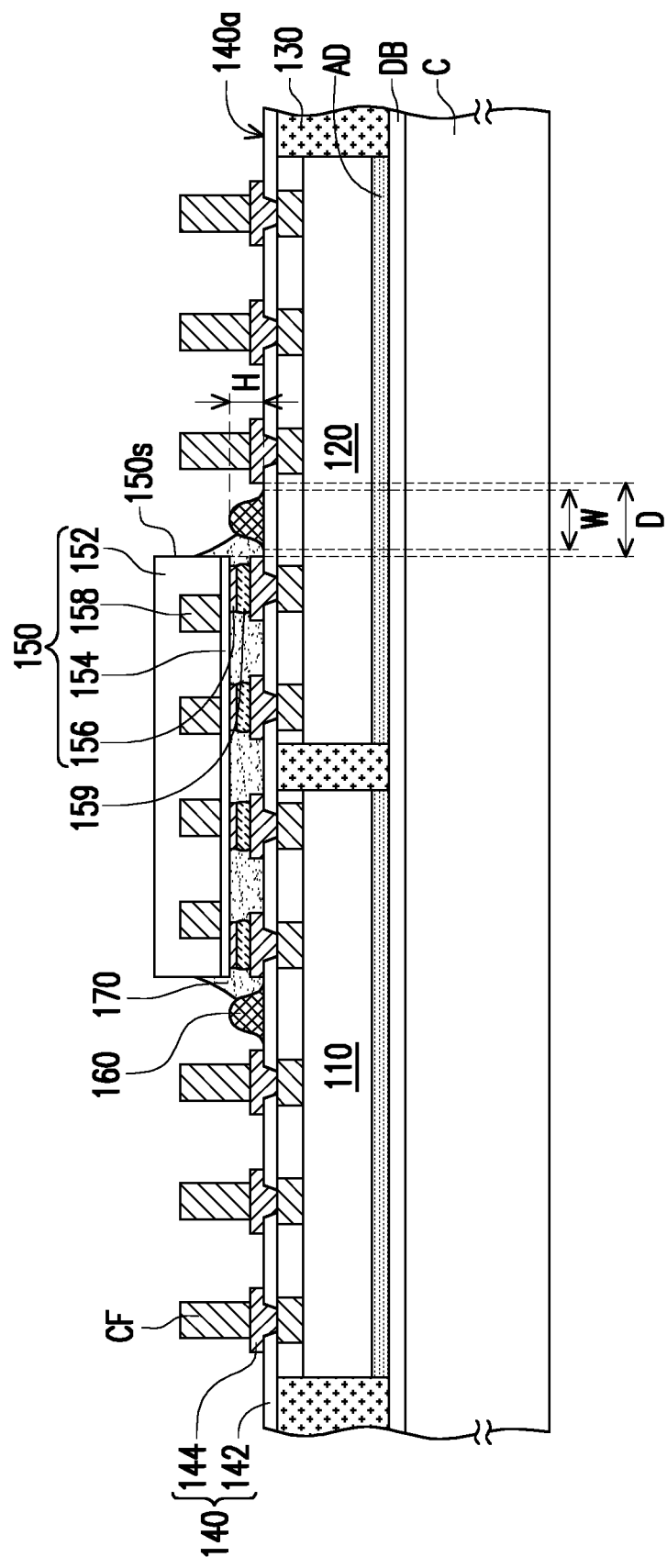

Referring to FIG. 3B, after forming the temporary underfill stopper 160, an underfill 170 is formed between the temporary underfill stopper 160, the die 150 and the redistribution structure 140. The forming method of the underfill 170 may be similar to the forming method of the underfill 170 as described for FIGS. 1E and 2B, so the detailed description thereof is omitted herein.

Figure 3C:
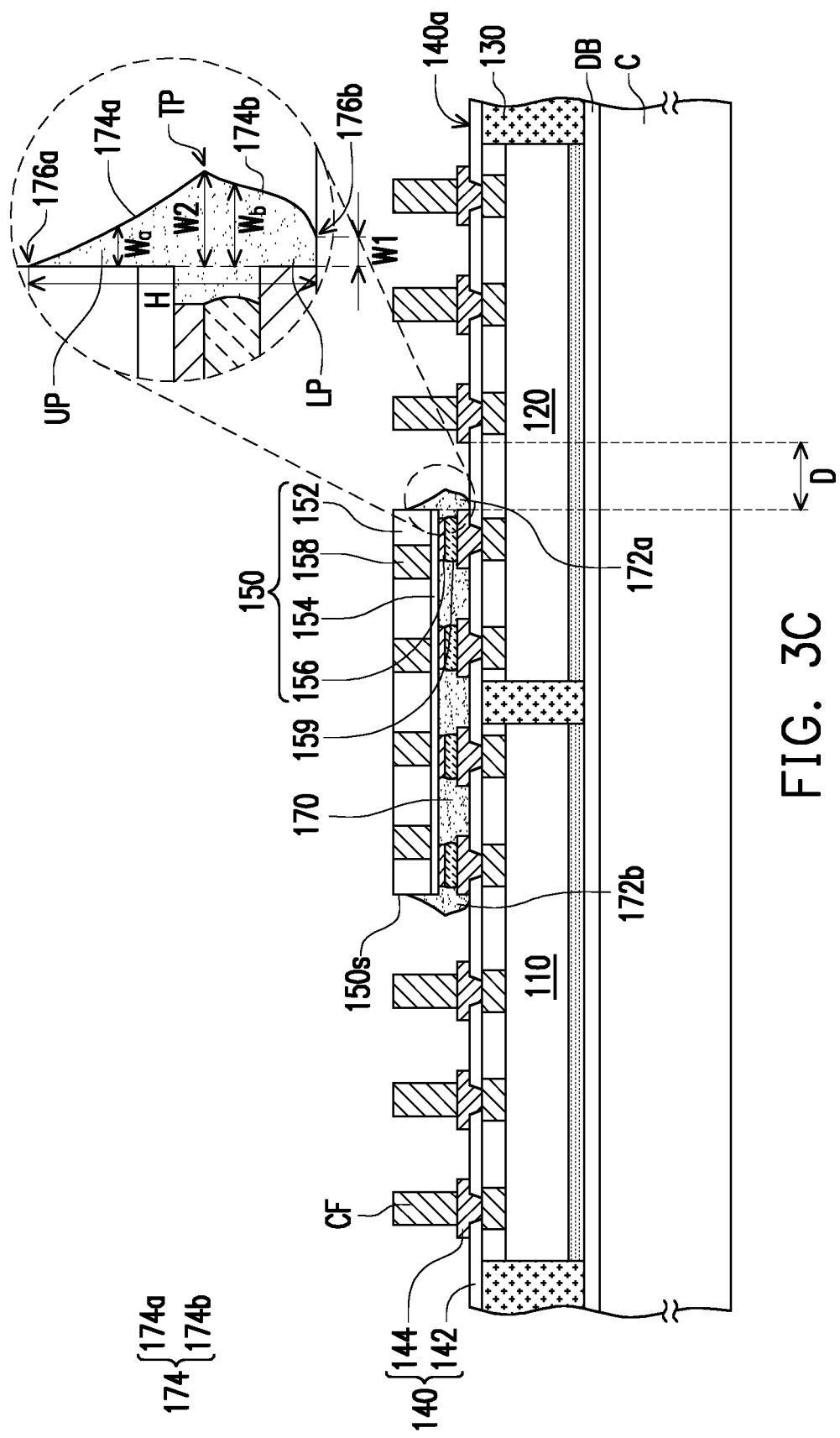

Referring to FIG. 3C, after forming the underfill 170, the temporary underfill stopper 160 is removed. The removal method of the temporary underfill stopper 160 may be similar to the removal method of the temporary underfill stopper 160 as described for FIG. 1F, so the detailed description thereof is omitted herein.

During the formation, a portion of the underfill 170 is in contact with the temporary underfill stopper 160, and thus a shape of the underfill 170 may be partially defined by the temporary underfill stopper 160. In some embodiments, when the temporary underfill stopper 160 is hill-like, the underfill 170 may have a diamond shape due to the shape and height of the temporary underfill stopper 160. The underfill 170 encapsulates a portion of the sidewall 150s of the die 150 and partially exposes a portion of the sidewall 150s (i.e., a top portion of the sidewall 150s) of the die 150. In some embodiments, the underfill 170 includes a plurality of underfill fillets (e.g., underfill fillets 172a, 172b) between the sidewalls 150s of the die 150 and the conductive features CF. The underfill fillet 172a, 172b is formed on the sidewall 150s at each side of the die 150 and extends over the surface 140a of the redistribution structure 140 between the sidewalls 150s of the die 150 and the conductive features CF.

The sidewall 174 of the underfill fillet 172a, 172b has an endpoint 176a on the sidewall 150s of the die 150, an endpoint 176b on the surface 140a of the redistribution structure 140 and a turning point TP between the endpoints 176a, 176b. In other words, the sidewall 174 includes a first sidewall 174a extending between the endpoint 176a and the turning point TP and a second sidewall 174b extending between the turning point TP and the endpoint 176b. Accordingly, the underfill fillet 172a, 172b may be divided into a first portion UP having the first sidewall 174a and a second portion LP having the second sidewall 174b. The second portion LP is disposed between the redistribution structure 140 and the first portion UP. In some embodiments, the first sidewall 174a of the first portion UP is smooth, substantially linear without a turning point, and the first portion UP has a triangle shape. In some embodiments, a width Wa of the first portion UP (i.e., a width between the sidewall 150s and the first sidewall 174a or a width between an extending line of the sidewall 150s and the first sidewall 174a) increases as the first portion UP becomes closer to the turning point TP. In some embodiments, the second sidewall 174b is non-linear and has at least one curvature. The curvature of the second sidewall 174b is complementary to a curvature of a sidewall of the hill-like temporary underfill stopper 160. The second sidewall 174b may have a plurality of tangent slopes, and the tangent slope increases as the second sidewall 174b becomes closer to the turning point TP. In some embodiments, a width Wb of the second portion LP (i.e., a width between the sidewall 150s and the second sidewall 174b or a width between the extending line of the sidewall 150s and the second sidewall 174b) increases as the second portion LP becomes closer to the surface 140a.

In some embodiments, the underfill fillet 172a, 172b has a width W1 measuring from the extending line of the sidewall 150s to the endpoint 176b, and a width W2 measuring from the sidewall 150s of the die 150 (or the extending line of the sidewall 150s of the die 150) to the turning point TP. The width W1 is also referred to as a bottom width of the second portion LP, and the width W2 is also referred to as a bottom width of the first portion UP. In some embodiments, the width W2 is larger than the width W1, and the width W2 is also the largest width of the underfill fillet 172a, 172b. In some embodiments, the width W1 may be in a range of 5 μm to 1800 μm, and the width W2 may be in a range of 5 μm to 1800 μm. The width W1 and the width W2 of the underfill fillet 172a, 172b are both smaller than the distance D between the die 150 and the conductive feature CF. Therefore, the underfill fillet 172a, 172b is not in contact with the conductive feature CF. In some embodiments, the underfill fillet 172a, 172b has a height H measuring from the surface 140a of the redistribution structure 140 to the endpoint 176a. The height H of the underfill fillet 172a is substantially the same as the height H of the underfill fillet 172b, for example. In some embodiments, the underfill fillets (e.g., underfill fillets 172a, 172b) on different sidewalls 150s of the die 150 are formed by partially contacting with the temporary underfill stopper 160, and thus the underfill fillets have similar or substantially the same shape, height, width or the like. However, the disclosure is not limited thereto. In some alternative embodiments, the underfill fillets on different sidewalls of the die may have different shapes, heights, width or the like.

Figure 3D:
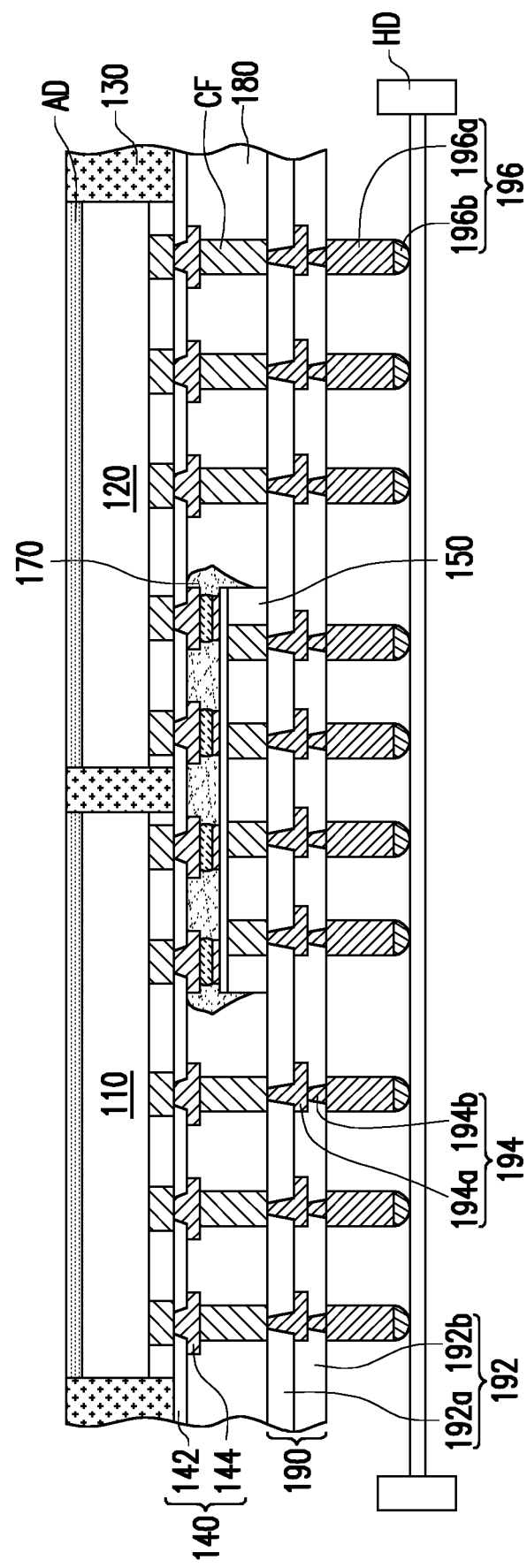

Referring to FIG. 3D, an encapsulant 180, a redistribution structure 190 and a plurality of conductive terminals 196 are sequentially formed over the redistribution structure 140, the die 150 and the underfill 170. Then, the formed structure is disposed on a holder HD and the temporary carrier C and the de-bonding layer DB are peeled off from the underlying structure.

Figure 3E:
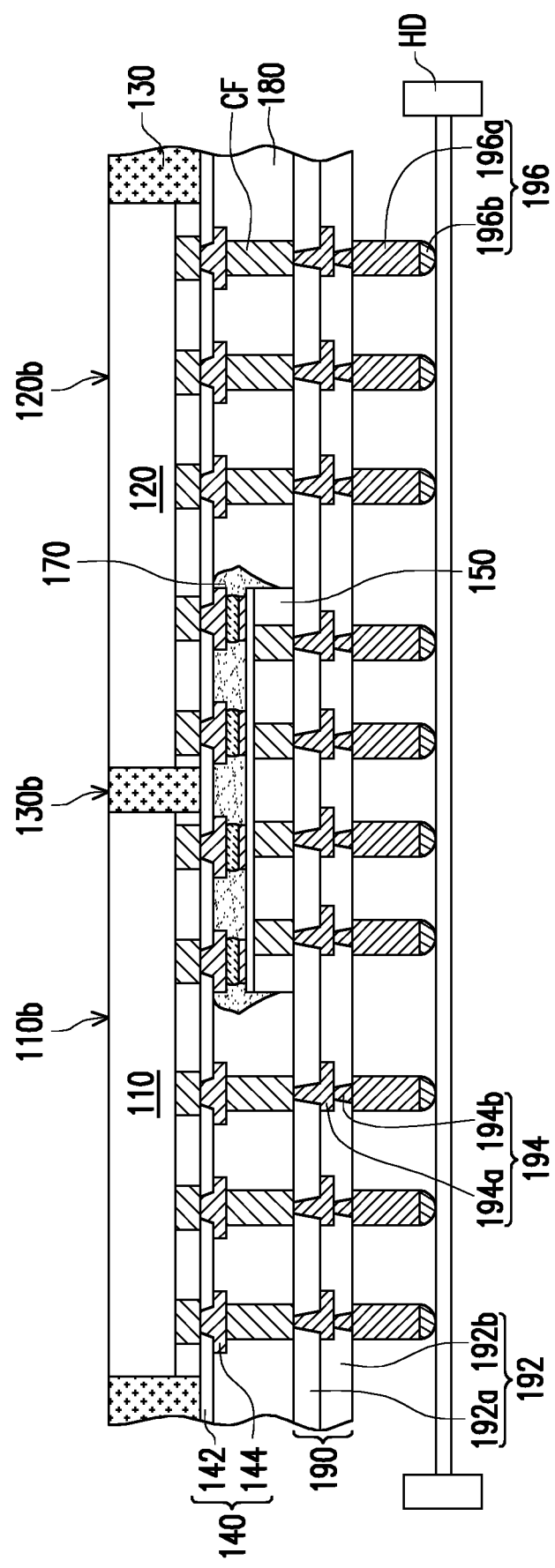
Figure 3F:
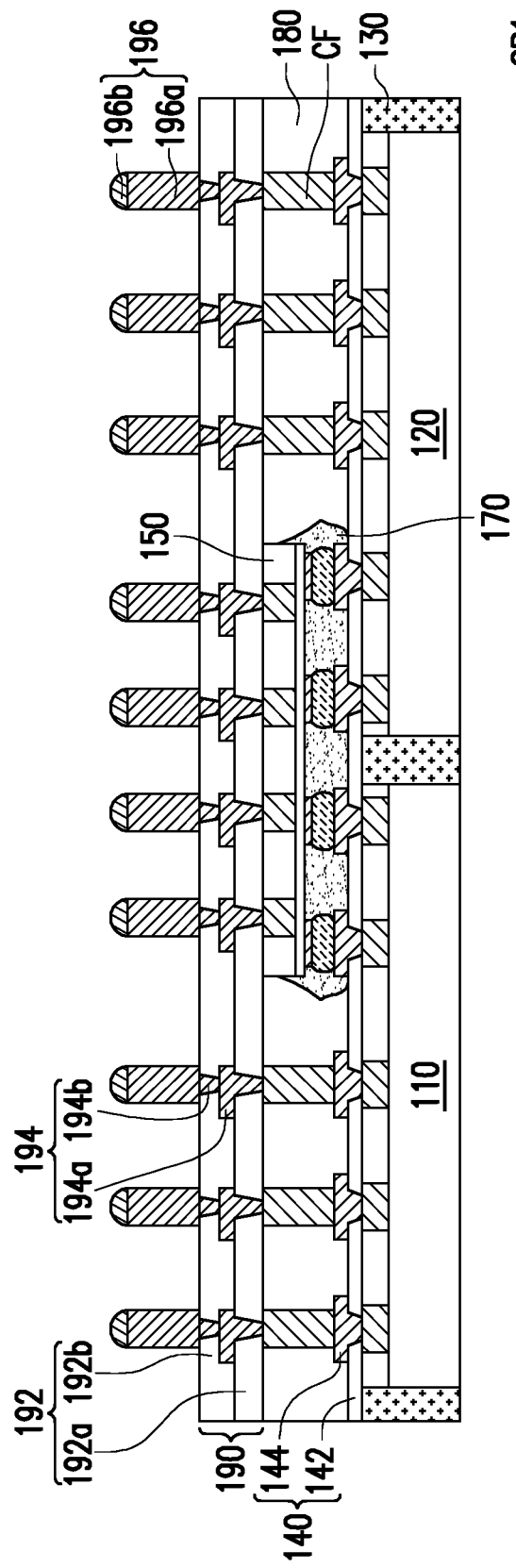

Referring to FIG. 3E, after removing the temporary carrier C and the de-bonding layer DB, the adhesive layers AD are removed. In some embodiments, a dry cleaning process is performed to remove the adhesive layers AD. The dry cleaning process may uses O2-based plasma, Ar-based plasma, CF4-based plasma, N2-based plasma, a combination thereof or other suitable plasma. In some embodiments, during the removal process of the adhesive layers AD, the surface 130b of the encapsulant 130 is exposed to the dry cleaning process and partially removed. Thus, the surface 130b of the encapsulant 130 is substantially flush with rear surfaces 110b, 120b of the dies 110, 120. After removing the adhesive layers AD, a singulation process is performed to form a plurality of semiconductor packages SP1 of FIG. 3F.

FIG. 4A to FIG. 4D are schematic cross-sectional views of various stages of manufacturing a semiconductor package in accordance with some embodiments. The method of FIGS. 4A to 4D is similar to the method of FIGS. 1A to 1I, hence the same reference numerals are used to refer to the same and liked parts, and its detailed description will be omitted herein. The main difference is described as follows.

Figure 4A:
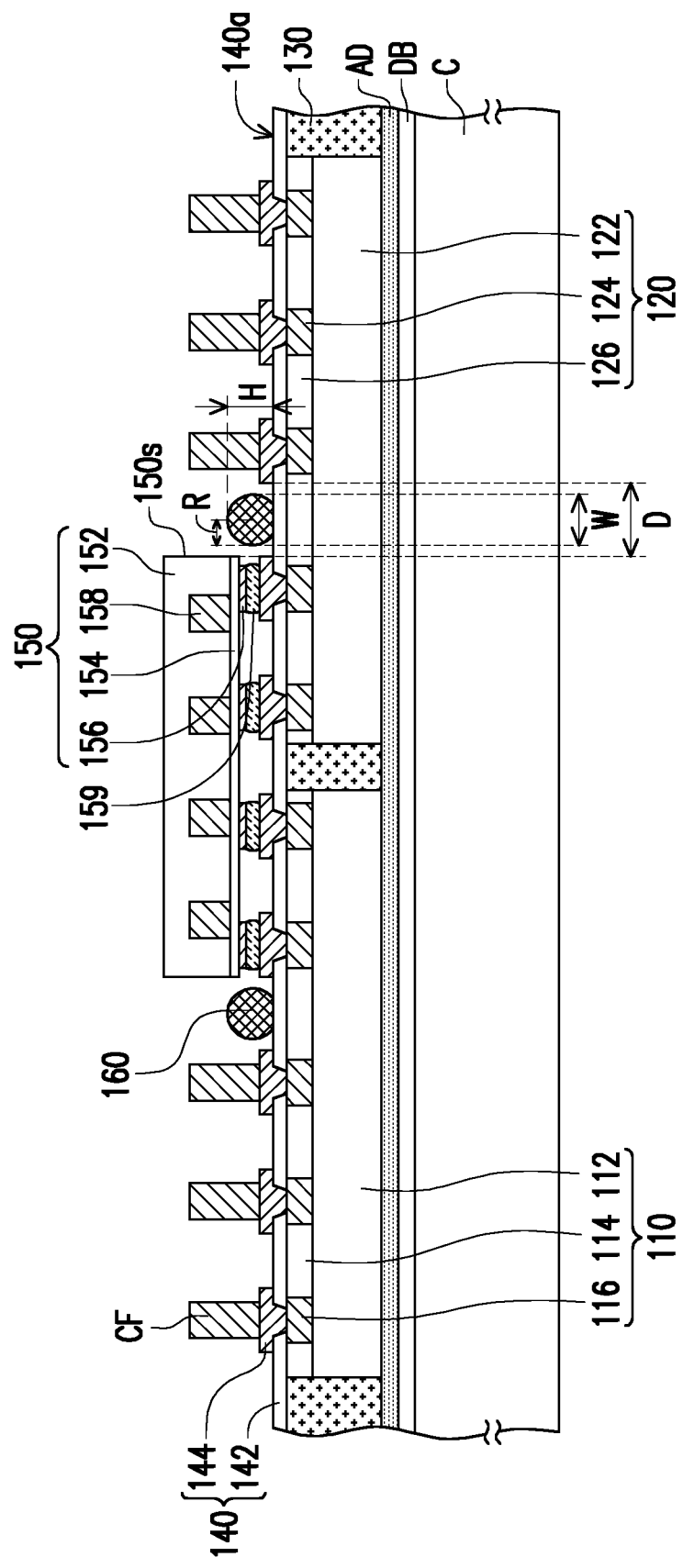
FIG. 4A to FIG. 4D are schematic cross-sectional views of various stages of manufacturing a semiconductor package in accordance with some embodiments.

Referring to FIG. 4A, a temporary underfill stopper 160 is formed on a surface 140a of a redistribution structure 140 between a die 150 and a plurality of conductive features CF. The structure of FIG. 4A is similar to the structure of FIG. 1E, and the main difference lies in the shape of the temporary underfill stopper 160. In some embodiments, the temporary underfill stopper 160 may have a box shape from a top view, and as shown in FIG. 4A, a cross-sectional shape of the temporary underfill stopper 160 may be like a ball with a truncated bottom. In some embodiments, a radius R of the temporary underfill stopper 160 may be in a range of 50 μm to 1000 μm. A height H of the temporary underfill stopper 160 is smaller than a height of the die 150. In some embodiments, the height H may be in a range of 10 μm to 1000 μm.

Figure 4B:
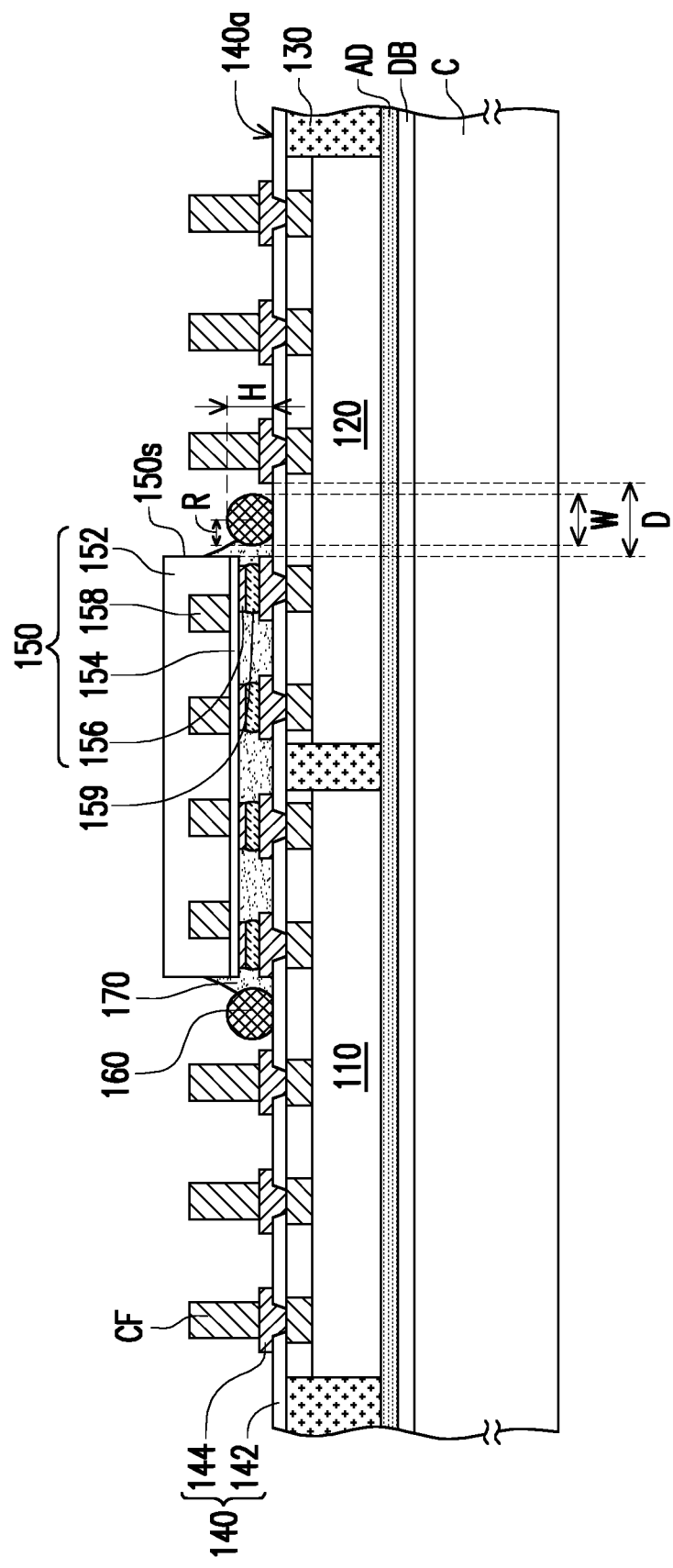

Referring to FIG. 4B, after forming the temporary underfill stopper 160, an underfill 170 is formed between the temporary underfill stopper 160, the die 150 and the redistribution structure 140. The forming method of the underfill 170 may be similar to the forming method of the underfill 170 in FIGS. 1E and 2B, so the detailed description thereof is omitted herein.

Figure 4C:
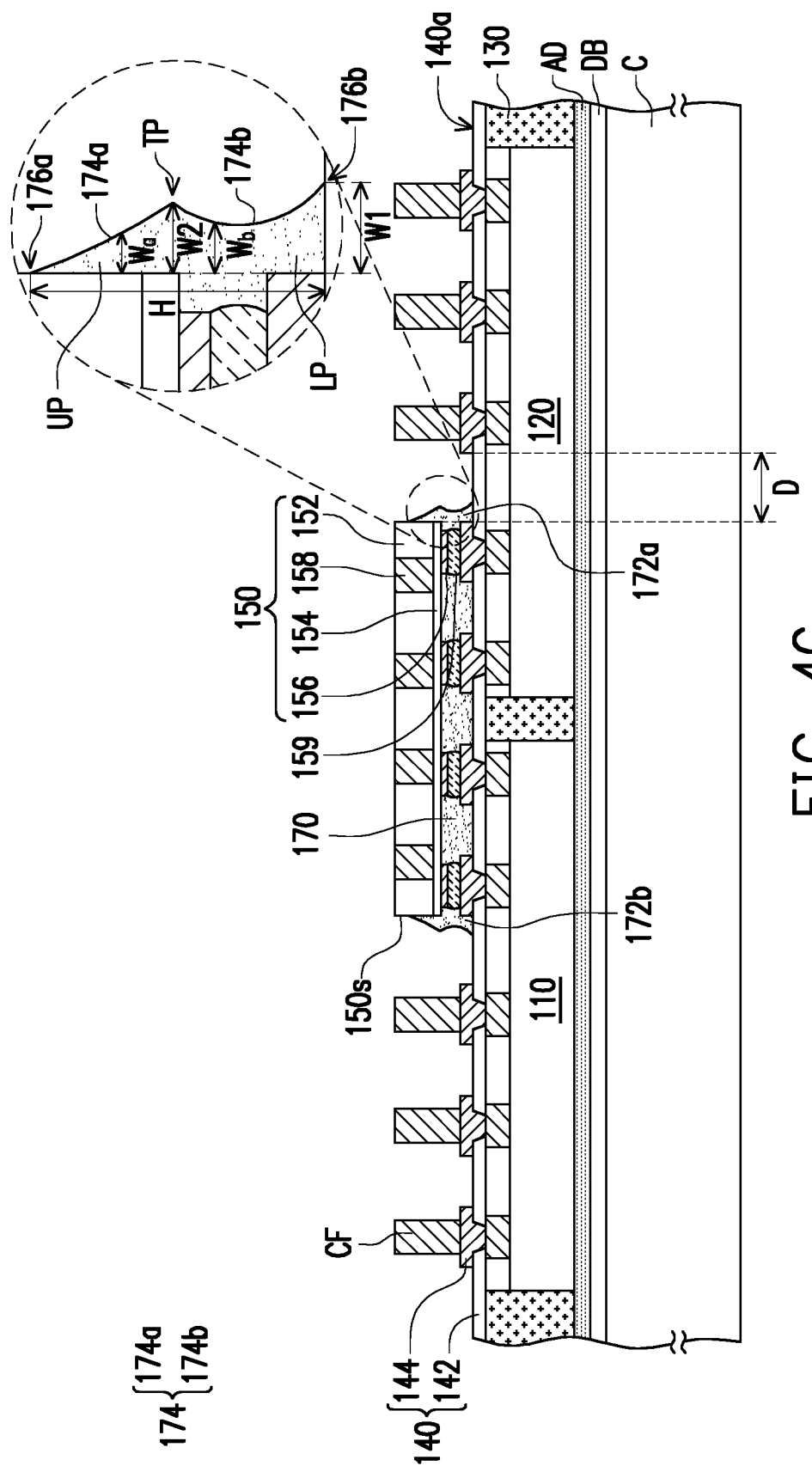
Figure 4D:
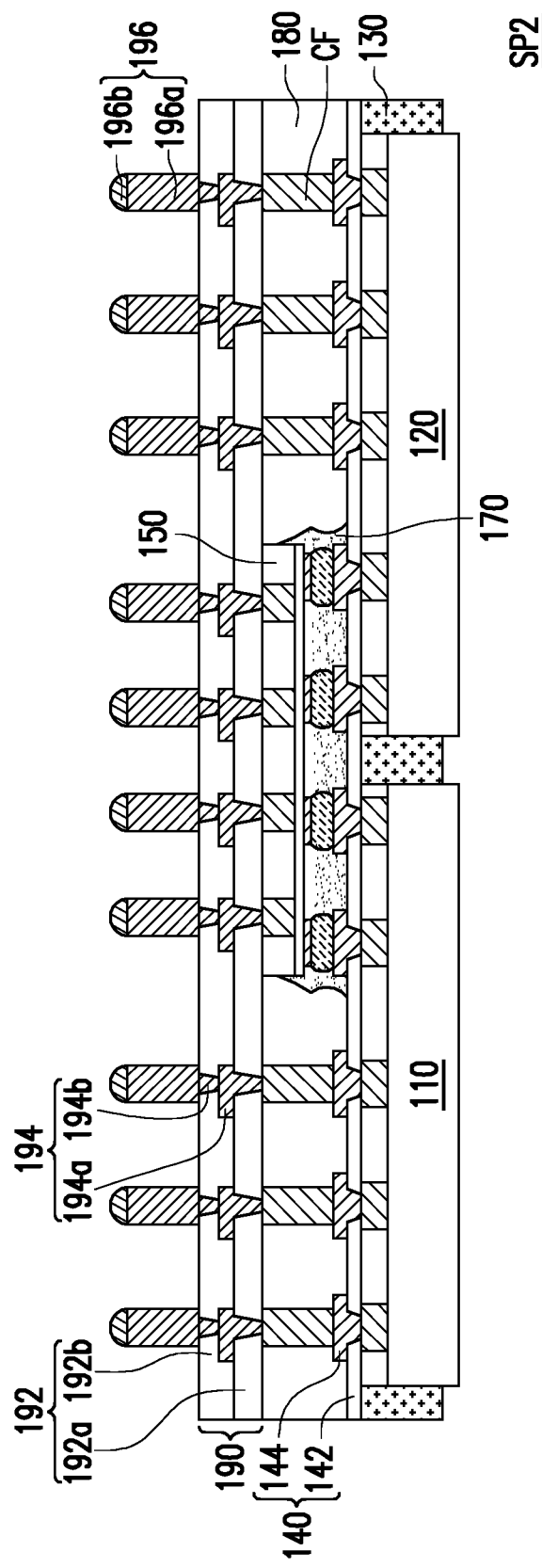

Referring to FIG. 4C, after forming the underfill 170, the temporary underfill stopper 160 is removed. The removal method of the temporary underfill stopper 160 may be similar to the removal method of the temporary underfill stopper 160 in FIG. 1F, so the detailed description thereof is omitted herein.

During the formation, a portion of the underfill 170 is in contact with the temporary underfill stopper 160, and thus a shape of the underfill 170 may be partially defined by the temporary underfill stopper 160. In some embodiments, when the temporary underfill stopper 160 has a ball shape, the underfill 170 may have a shape as shown in FIG. 4C due to the shape and height of the temporary underfill stopper 160. The underfill 170 encapsulates a portion of the sidewall 150s of the die 150 and partially exposes a portion of the sidewall 150s (i.e., a top portion of the sidewall 150s) of the die 150. In some embodiments, the underfill 170 includes a plurality of underfill fillets (e.g., underfill fillets 172a, 172b) between the sidewalls 150s of the die 150 and the conductive features CF. The underfill fillet 172a, 172b is formed on the sidewall 150s at each side of the die 150 and extends over the surface 140a of the redistribution structure 140 between the sidewalls 150s of the die 150 and the conductive features CF. The sidewall 174 of the underfill fillet 172a, 172b has an endpoint 176a on the sidewall 150s of the die 150, an endpoint 176b on the surface 140a of the redistribution structure 140 and a turning point TP between the endpoints 176a, 176b. In other words, the sidewall 174 includes a first sidewall 174a extending between the endpoint 176a and the turning point TP and a second sidewall 174b extending between the turning point TP and the endpoint 176b. Accordingly, the underfill fillet 172a, 172b may be divided into a first portion UP having the first sidewall 174a and a second portion LP having the second sidewall 174b. The second portion LP is disposed between the redistribution structure 140 and the first portion UP. In some embodiments, the first sidewall 174a of the first portion UP is smooth, substantially linear without a turning point, and the first portion UP has a triangle shape. In some embodiments, a width Wa of the first portion UP (i.e., a width between the sidewall 150s and the first sidewall 174a or a width between an extending line of the sidewall 150s and the first sidewall 174a) increases as the first portion UP becomes closer to the turning point TP. In some embodiments, the second sidewall 174b is non-linear and has at least one curvature. The curvature of the second sidewall 174b is complementary to a curvature of a sidewall of the ball-shaped temporary underfill stopper 160. In some embodiments, a width Wb of the second portion LP (i.e., a width between the sidewall 150s and the second sidewall 174b or a width between the extending line of the sidewall 150s and the second sidewall 174b) decreases and then increases as the second portion LP becomes closer to the surface 140a.

In some embodiments, the underfill fillet 172a, 172b has a width W1 measuring from the extending line of the sidewall 150s to the endpoint 176b, and a width W2 measuring from the sidewall 150s of the die 150 (or the extending line of the sidewall 150s of the die 150) to the turning point TP. In some embodiments, the width W1 is larger than the width W2, and the width W1 is also the largest width of the underfill fillet 172a, 172b. In some embodiments, the width W1 may be in a range of 5 μm to 1800 μm, and the width W2 may be in a range of 5 μm to 1800 μm. The width W1 and the width W2 of the underfill fillet 172a, 172b are both smaller than the distance D between the die 150 and the conductive feature CF. Therefore, the underfill fillet 172a, 172b is not in contact with the conductive feature CF. In some embodiments, the underfill fillet 172a, 172b has a height H measuring from the surface 140a of the redistribution structure 140 to the endpoint 176a. The height H of the underfill fillet 172a is substantially the same as the height H of the underfill fillet 172b, for example. In some embodiments, the underfill fillets (e.g., underfill fillets 172a, 172b) on different sidewalls 150s of the die 150 are formed by partially contacting with the temporary underfill stopper 160, and thus the underfill fillets have similar or substantially the same shape, height, width or the like. However, the disclosure is not limited thereto. In some alternative embodiments, the underfill fillets on different sidewalls of the die may have different shapes, height, width or the like.

In some embodiments, the underfill fillet 172a, 172b has a width W1 measuring from the extending line of the sidewall 150s to the endpoint 176b, and a width W2 measuring from the sidewall 150s of the die 150 (or the extending line of the sidewall 150s of the die 150) to the turning point TP. In some embodiments, the width W1 is larger than the width W2, and the width W1 is also the largest width of the underfill fillet 172a, 172b. In some embodiments, the width W1 may be in a range of 5 μm to 1800 μm, and the width W2 may be in a range of 5 μm to 1800 μm. The width W1 and the width W2 of the underfill fillet 172a, 172b are both smaller than the distance D between the die 150 and the conductive feature CF. Therefore, the underfill fillet 172a, 172b is not in contact with the conductive feature CF. In some embodiments, the underfill fillet 172a, 172b has a height H measuring from the surface 140a the redistribution structure 140 to the endpoint 176a. The height H of the underfill fillet 172a is substantially the same as the height H of the underfill fillet 172b, for example. In some embodiments, the underfill fillets (e.g., underfill fillets 172a, 172b) on different sidewalls 150s of the die 150 are formed by partially contacting with the temporary underfill stopper 160, and thus the underfill fillets have similar or substantially the same shape, height, width or the like. However, the disclosure is not limited thereto. In some alternative embodiments, the underfill fillets on different sidewalls of the die may have different shapes, height, width or the like.

Then, an encapsulant 180, a redistribution structure 190 and a plurality of conductive terminals 196 are sequentially formed over the redistribution structure 140, the die 150 and the underfill 170. After that, the temporary carrier C, the de-bonding layer DB and the adhesive layer AD are sequentially removed. Then, a singulation process is performed to form a plurality of semiconductor packages SP2 of FIG. 4D.

In above embodiments, the temporary underfill stopper 160 is continuously formed around the die 150. In other words, the temporary underfill stopper 160 is formed at all sides of the die 150. Thus, each sidewall of the underfill 170 has a shape complementary to the temporary underfill stopper 160. However, in some alternative embodiments (not shown), the temporary underfill stopper 160 may be not formed at each side of the die 150. Accordingly, only a portion of the sidewalls of the underfill 170 which is in contact with the temporary underfill stopper 160 has a shape complementary to the temporary underfill stopper 160.

FIG. 5A to FIG. 5F are schematic cross-sectional views of various stages of manufacturing a semiconductor package in accordance with some embodiments.

Figure 5A:
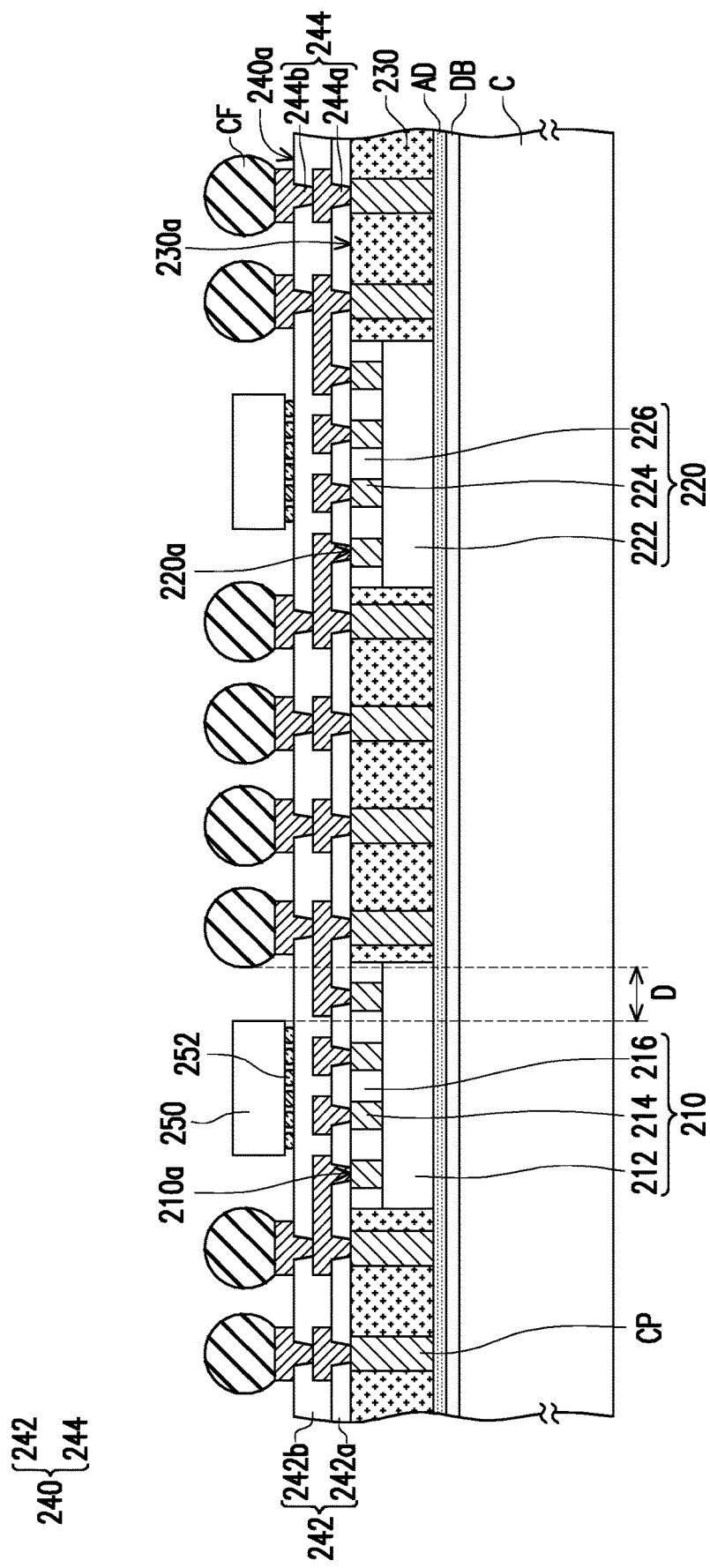
FIG. 5A to FIG. 5F are schematic cross-sectional views of various stages of manufacturing a semiconductor package in accordance with some embodiments.

Referring to FIG. 5A, a plurality of dies 210, 220 and a plurality of conductive pillars CP are disposed on a temporary carrier C. In some embodiments, a de-bonding layer DB and an adhesive layer AD are sequentially formed on the temporary carrier C. In some embodiments, the conductive pillars CP are disposed to surround the dies 210, 220 and located between the dies 210, 220. Then, an encapsulant 230 is formed on the temporary carrier C to encapsulate the dies 210, 220 and the conductive pillars CP. In some embodiments, a surface 230a of the encapsulant 230, a front surface 210a of the die 210, and the front surface 220a of the die 220 are substantially coplanar. After that, a redistribution structure 240 is formed on the encapsulant 230 to electrically connect to the dies 210, 220 and the conductive pillars CP. The dies 210, 220, the encapsulant 230 and the redistribution structure 240 may be similar to the dies 110, 120 and the encapsulant 130 in FIG. 1A and the redistribution structure 190 in FIG. 1G, so the detailed description thereof is omitted herein. For example, the die 210 includes a semiconductor substrate 212, conductive connectors 214 distributed on the semiconductor substrate 212, and a protection layer 216 disposed on the semiconductor substrate 212 and covering the conductive connectors 214 for protection. The die 220 may include a semiconductor substrate 222, conductive connectors 224 distributed on the semiconductor substrate 222, and a protection layer 226 disposed on the semiconductor substrate 222 and covering the conductive connectors 224 for protection. The redistribution structure 240 may include a patterned dielectric layer 242 and a patterned conductive layer 244. In some embodiments, a plurality of polymer sublayers (e.g., polymer sublayers 242a, 242b) and a plurality of metallic sublayers (e.g., metallic sublayers 244a, 244b) are stacked alternately to form the redistribution structure 240.

Then, a plurality of conductive features CF and at least one die 250 are formed on a surface 240a of the redistribution structure 240. In some embodiments, a distance (i.e., the shortest distance) D between the die 250 and the conductive feature CF is in a range of 50 μm to 1000 μm. In some embodiments, a plurality of under-ball metallurgy (UBM) patterns (e.g., the metallic sublayer 244b) may be formed in the outermost polymer sublayer 242b of the redistribution structure 240. The conductive features CF may be disposed over the UBM patterns. In some embodiments, the conductive features CF are attached to the UBM patterns through a solder flux. In some embodiments, the conductive features CF are solder balls and formed a ball grid array (BGA). In some embodiments, the conductive features CF may be disposed on the redistribution structure 240 through a ball placement process and/or a reflow process. In some alternative embodiments, the conductive features CF are C4 bumps, micro-bumps, conductive pillars, ENEPIG formed bumps, combination thereof (e.g., a metal pillar having a solder cap attached thereof), or the like.

In some embodiments, the die 250 is an integrated passive device (IPD) die, and the die 250 may include resistors, capacitors, inductors, or the like. In some embodiments, the die 250 is electrically connected to the redistribution structure 240 through a plurality of solder joints 252 disposed therebetween. The solder joints 252 may be similar to the solder joints 159 in FIG. 1C, so the detailed description thereof is omitted herein.

Figure 5B:
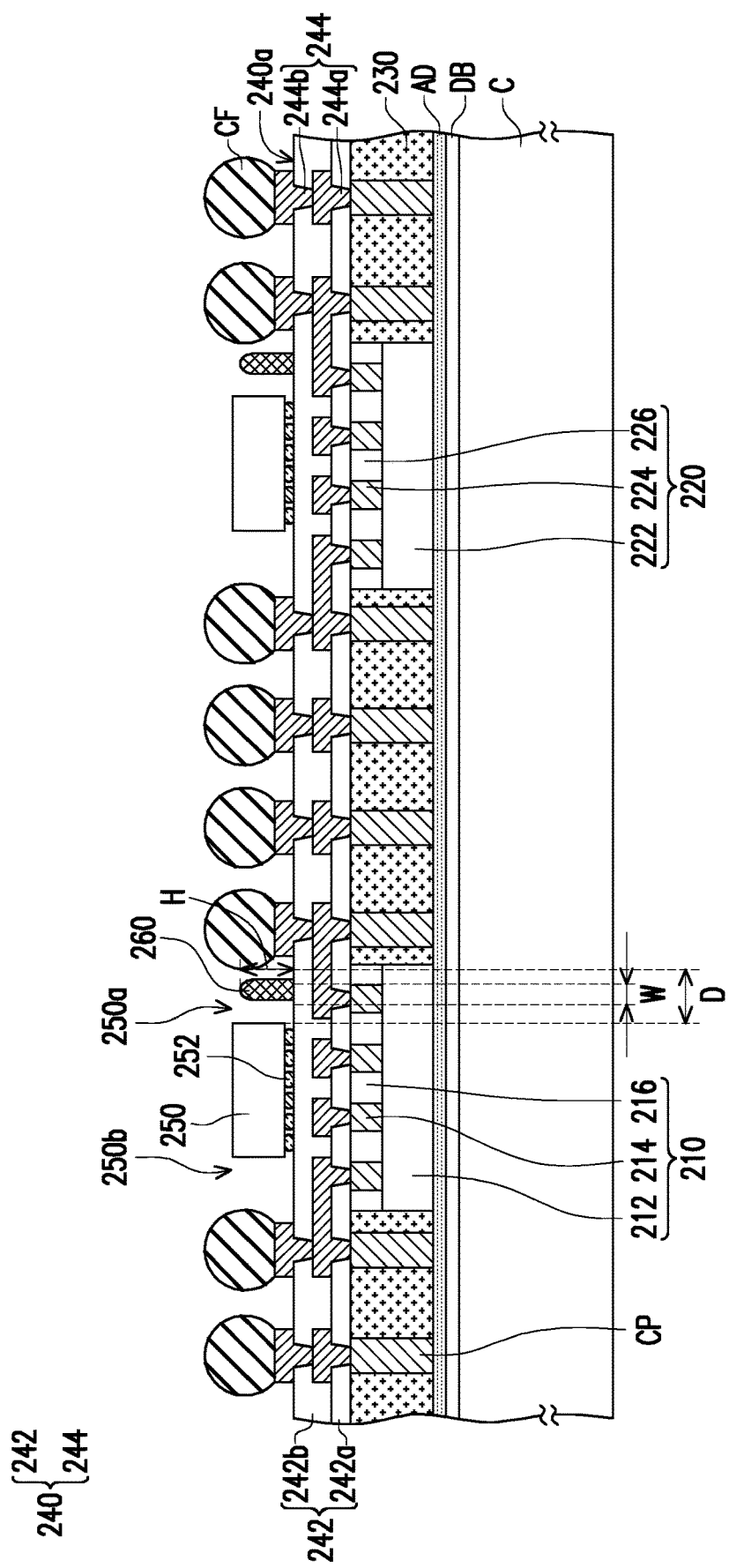
Figure 6B:
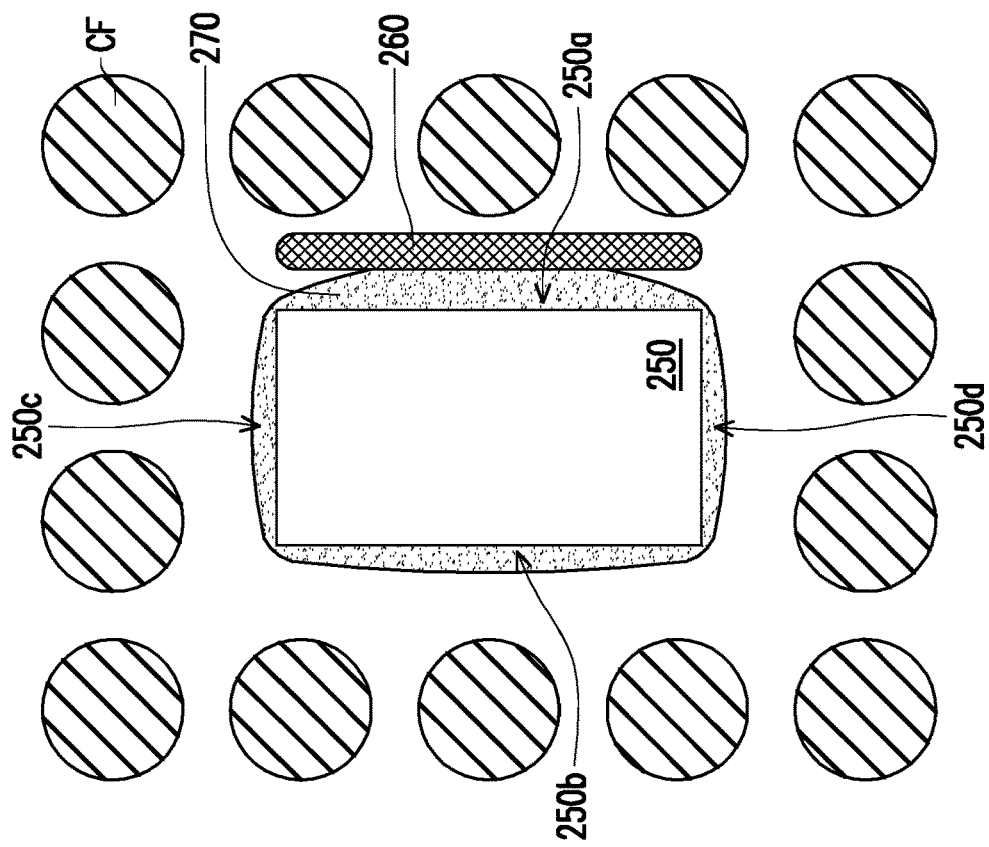
FIG. 6B is a schematic top view of FIG. 5C.
Figure 6A:
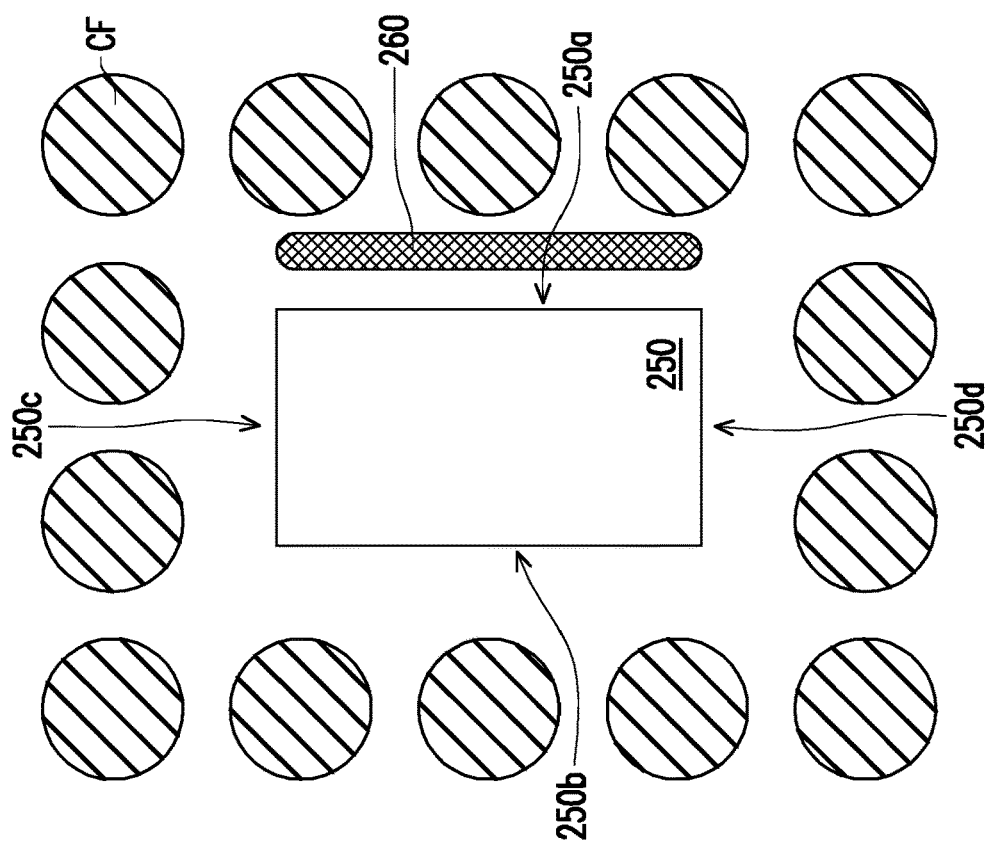
FIG. 6A is a schematic top view of FIG. 5B.

Referring to FIG. 5B and FIG. 6A which is a top view of FIG. 5B, a temporary underfill stopper 260 is formed on the surface 240a of the redistribution structure 240 between the die 250 and the conductive features CF. In some embodiments, the temporary underfill stopper 260 is formed on the outermost polymer sublayer 242b. The temporary underfill stopper 260 is disposed between and separated from the conductive features CF and the die 250, in other words, the temporary underfill stopper 260 is not in contact with the conductive feature CF and the die 250. In some embodiments, the temporary underfill stopper 260 is merely formed at a single side 250a of the die 250. In some embodiments, the side 250a is selected as a dispensing location of the underfill. In some embodiments, the temporary underfill stopper 260 is formed by dispensing a material of the temporary underfill stopper 260 along the side 250a of the die 250, and then curing the material. In some embodiments, as shown in FIG. 6A, the temporary underfill stopper 260 is bar-shaped, and as shown in FIG. 5B, a cross-sectional shape of the temporary underfill stopper 260 is like a pillar having a curved top surface. The material and the forming method of the temporary underfill stopper 260 may be similar to those of the temporary underfill stopper 160 in FIG. 1D, so the detailed description thereof is omitted herein. In addition, according to the design, in some alternative embodiments, the temporary underfill stopper may be located at more than one side of the die.

Figure 5C:
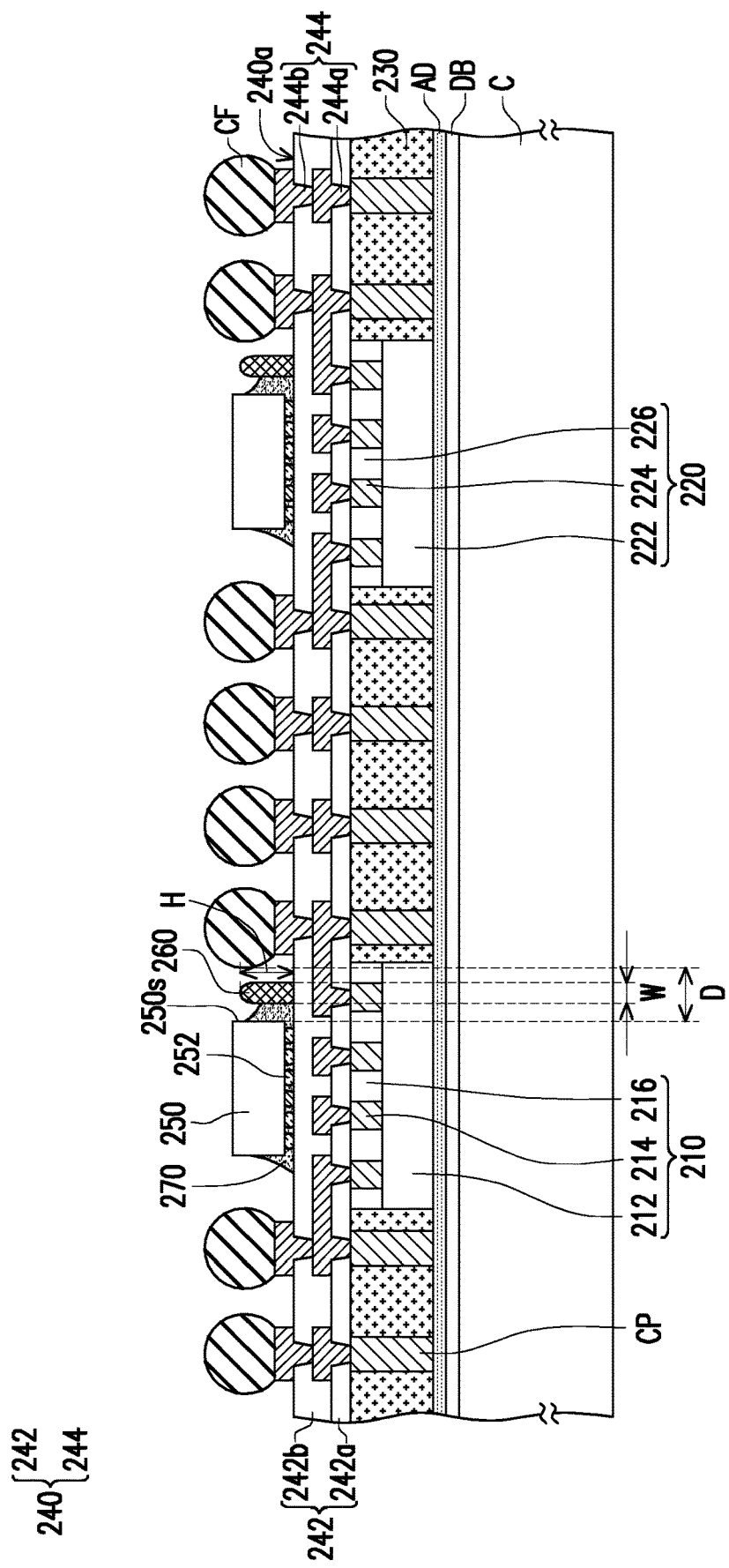

Referring to FIGS. 5C and 6B which is a top view of FIG. 5B, after forming the temporary underfill stopper 260, an underfill 270 is formed between the die 250 and the conductive features CF and the die 250 and the redistribution structure 240. In some embodiments, a material of the underfill 270 is initially dispensed at the side 250*a* (i.e., the dispensing location) between a sidewall 250*s* of the die 250 and the temporary underfill stopper 260. For example, a one sided dispense process is utilized. By capillary action, the material of the underfill 270 flows between the die 250 and toward other sides 250*b*, 250*c*, 250*d* of the die 250. Then, the curing process is performed to harden the material of the underfill 270 so as to form the underfill 270.

Conventionally, since the amount of the material of the underfill remained at the dispensing location may be much more than other locations, the formed underfill easily bleeds to the conductive features adjacent to the dispensing location. In some embodiments, the temporary underfill stopper 260 is formed at the dispensing location to restrict or stop the material of the underfill 270 to flow from bleeding outward with an undesired width. Thus, the above embodiments prevents the underfill 270 from touching and bleeding to the conductive features CF adjacent to dispensing location (i.e., the side 250*a* of the die 250). Accordingly, cracks and broken connections of the conductive features CF may be prevented during subsequent thermal processes. In addition, the underfill 270 may cover the joints 252 of the die 250 and the outermost metallic sublayer 244*b* of the redistribution structure 240, thereby strengthening the attachment and helping to prevent the thermal stresses from breaking the connection therebetween.

In some embodiments, the distance D between the die 250 and the conductive feature CF at the side 250*a* is substantially the same as a distance between the die 250 and the conductive feature CF at other sides 250*b*, 250*c*, 250*d*. However, the disclosure is not limited thereto. In some alternative embodiments, the distance D between the die 250 and the conductive feature CF at the side 250*a* is different from the distance between the die 250 and the conductive feature CF at another side 250*b*, 250*c* or 250*d*. For example, the distance D between the die 250 and the conductive feature CF at the side 250*a* is smaller than the distance between the die 250 and the conductive feature CF at other sides 250*b*, 250*c*, 250*d* of the die 250. In other words, the conductive feature CF at the side 250*a* is disposed at a location that is closer to the die 250 than the conductive feature CF at other sides 250*b*, 250*c*, 250*d* of the die 250. Since the distance between the die 250 and the conductive feature CF immediately adjacent to the die 250 is short at the side 250*a* of the die 250, the underfill 270 may be bled to and contact the conductive feature CF easily. In this case, the temporary underfill stopper 260 may be merely located at the side 250*a* to prevent the underfill 270 from bleeding to the conductive feature CF.

Figure 5D:
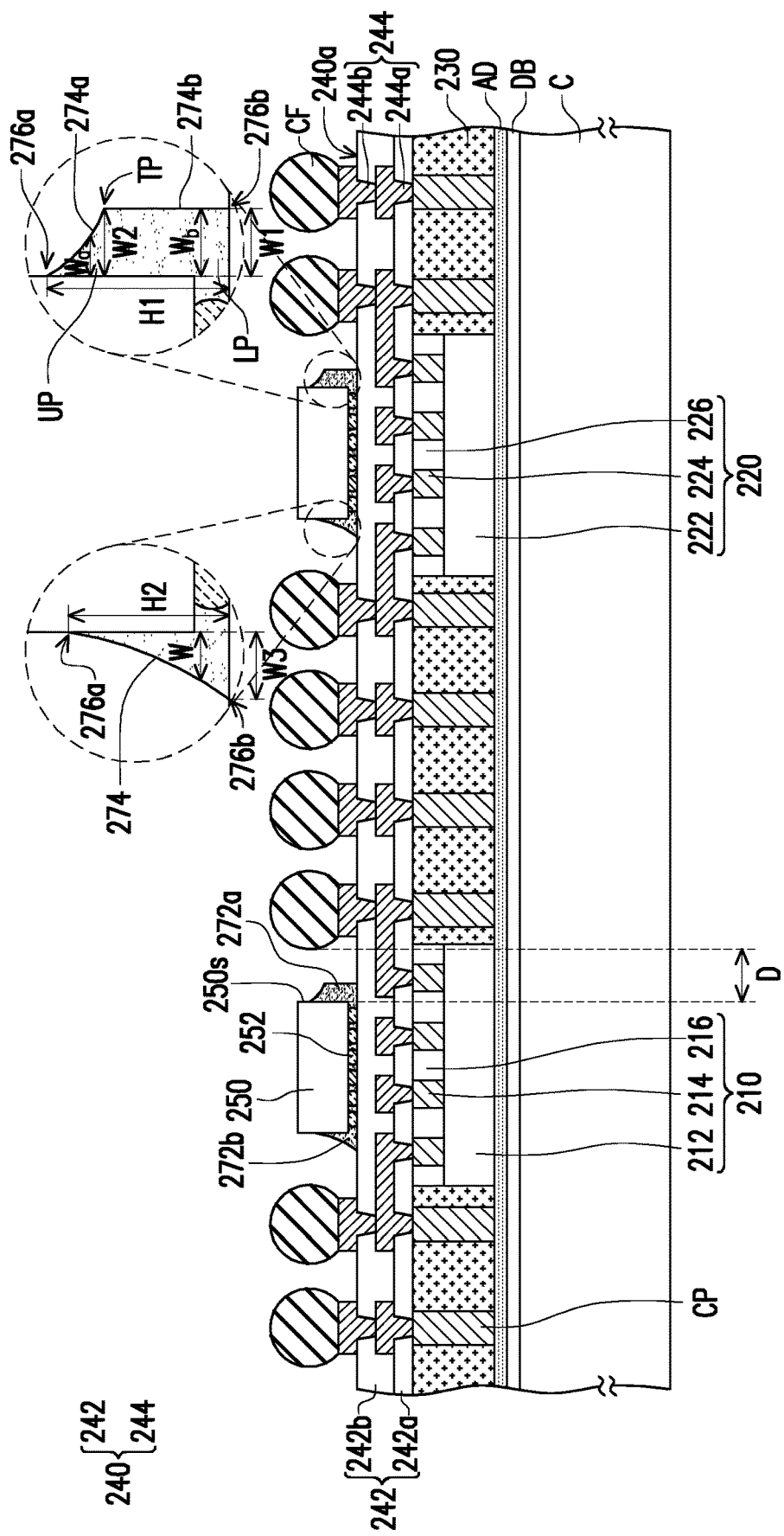

Referring to FIG. 5D, after forming the underfill 270, the temporary underfill stopper 260 is removed. The removal method of the temporary underfill stopper 260 may be similar to the removal method of the temporary underfill stopper 160 in FIG. 1F, so the detailed description thereof is omitted herein.

During the formation, a portion of the underfill 270 is in contact with the temporary underfill stopper 260, and thus a shape of the underfill 270 may be partially defined by the temporary underfill stopper 260. The underfill 270 encapsulates a portion of the sidewall 250*s* of the die 250 and partially exposes a portion of the sidewall 250*s* (i.e., a top portion of the sidewall 250*s*) of the die 250. In some embodiments, the underfill 270 includes a plurality of underfill fillets (e.g., underfill fillets 272*a*, 272*b*) between sidewalls 250*s* of the die 250 and the conductive features CF. As shown in FIGS. 5C and 6B, the underfill fillet 272*a* at the side 250*a* is formed by partially contacting with the temporary underfill stopper 260 while other underfill fillets (e.g., the underfill fillet 272*b*) at the sides 250*b*, 250*c*, 250*d* are not. Therefore, a shape of the underfill fillet 272*a* may be different from shapes of other underfill fillets. In some embodiments, a sidewall 274 of the underfill fillet 272*a* has an endpoint 276*a* on the sidewall 250*s* of the die 250, an endpoint 276*b* on the surface 240*a* of the redistribution structure 240 and a turning point TP between the endpoints 276*a*, 276*b*. In other words, the sidewall 274 includes a first sidewall 274*a* extending between the endpoint 276*a* and the turning point TP and a second sidewall 274*b* extending between the turning point TP and the endpoint 276*b*. Accordingly, the underfill fillet 272*a* may be divided into a first portion UP having the first sidewall 274*a* and a second portion LP having the second sidewall 274*b*. In some embodiments, a width Wa of the first portion UP increases as the first portion UP becomes closer to the turning point TP, and a width Wb of the second portion LP is substantially the same. In some embodiments, the underfill fillet 272*a* may be similar to the underfill fillet 172*a* of FIG. 1F, so the detailed description thereof is omitted herein.

In some embodiments, the underfill fillet 272*a* has a width W1 measuring from an extending line of the sidewall 250*s* of the die 250 to the endpoint 276*b* of the underfill fillet 272*a*, and a width W2 measuring from the sidewall 250*s* of the die 250 (or the extending line of the sidewall 250*s* of the die 250) to the turning point TP. The width W1 is also referred to as a bottom width of the second portion LP, and the width W2 is also referred to as a bottom width of the first portion UP. In some embodiments, the width W2 is substantially equal to the width W1, and the width W1, W2 is also the largest width of the underfill fillet 272*a*. In some embodiments, the width W1, W2 may be in a range of 5 μm to 1800 μm. The width W1 and the width W2 of the underfill fillet 272*a* are both smaller than the distance D between the die 250 and the conductive feature CF. Therefore, the underfill fillet 272*a* is prevented from being in contact with the conductive feature CF.

In some embodiments, the underfill fillet at the side 250*b*, 250*c* or 250*d* (e.g., the underfill fillet 272*b* at the side 250*b*) is formed without the temporary underfill stopper 260, and thus a sidewall of the underfill fillet at the side 250*b*, 250*c* or 250*d* (e.g., a sidewall 274 of the underfill fillet 272*b* at the side 250*b*) is smooth, curved without a turning point. For example, the sidewall 274 of the underfill fillet 272*b* extends from an endpoint 276*a* on the sidewall 250*s* of the die 250 to an endpoint 276*b* on the surface 240*a* of the redistribution structure 240 without a turning point. In some embodiments, the underfill fillet 272*b* has a cross-sectional shape such as triangle or other suitable shape. In some embodiments, the underfill fillet 272*b* has a width W measuring from the extending line of the sidewall 250*s* of the die 250 to an intermediate point between the endpoints 276*a*, 276*b*, and the width W increases as the underfill fillet 272*b* becomes closer to the surface 240*a* of the redistribution structure 240. The underfill fillet 272*b* has the largest width W3 at the bottom measuring from the extending line of the sidewall 250*s* of the die 250 to the endpoint 276*b* of the underfill fillet 272*b*. The largest width W3 is smaller than the distance D between the die 250 and the conductive feature CF. Therefore, the underfill fillet 272*b* is prevented from being in contact with the conductive feature CF. The largest width W3 of the underfill fillet 272*b* may be smaller than the largest width (i.e., the width W1, W2) of the underfill fillet 272*a*, for example.

In some embodiments, the underfill fillet 272a has a height H1 measuring from the surface 240a of the redistribution structure 240 to the endpoint 276a the underfill fillet 272a, and the underfill fillet 272b has a height H2 measuring from the surface 240a of the redistribution structure 240 to the endpoint 276a of the underfill fillet 272b. In some embodiments, the height H1 of the underfill fillet 272a may be larger than the height H2 of the underfill fillet 272b. However, the disclosure is not limited thereto. In some alternative embodiments, the height H1 of the underfill fillet 272a is not larger than the height H2 of the underfill fillet 272b. In addition, in some embodiments, the underfill fillet 272a has different shape from other underfill fillets. However, the disclosure is not limited thereto. In some alternative embodiments, if the temporary underfill stopper is located at more than one side of the die 250, another underfill fillet may have a similar shape to or the same shape as the underfill fillet 272a.

Figure 5E:
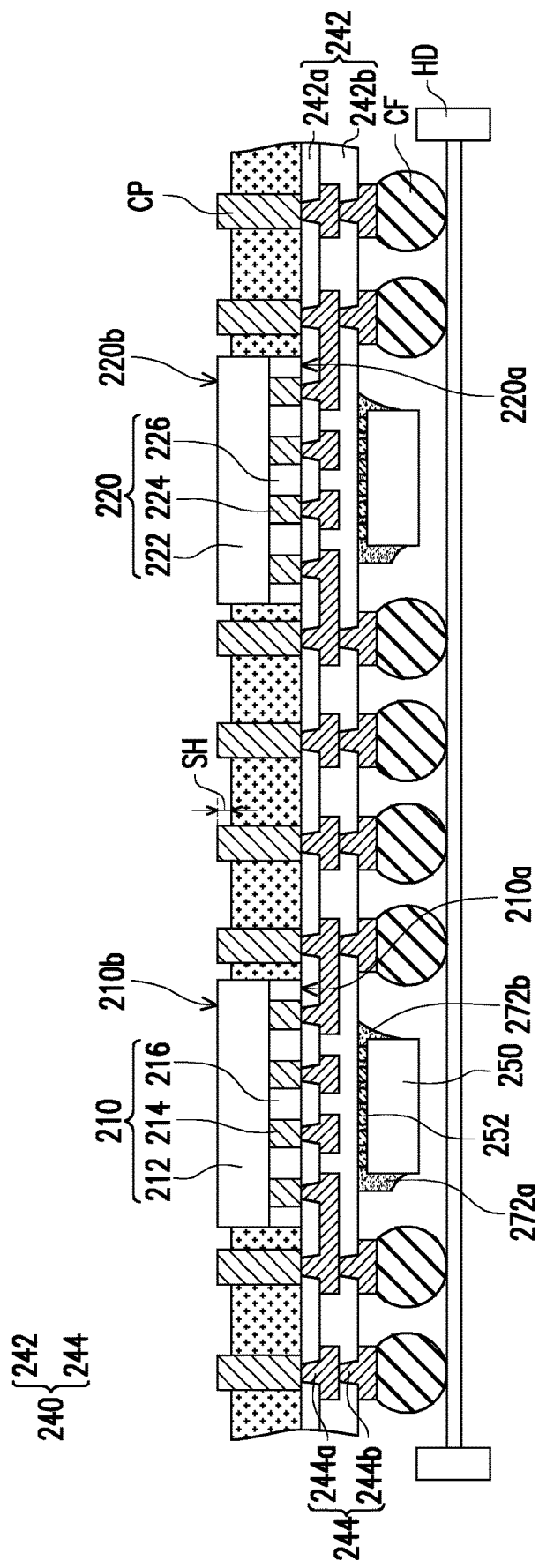

Referring to FIG. 5E, the formed structure is disposed on a holder HD. The temporary carrier C and the de-bonding layer DB are peeled off from the underlying structure. After that, the adhesive layer AD is removed. The adhesive layer AD may be removed by the method described in FIG. 1I or other suitable method. In some embodiments, after removing the adhesive layer AD by a dry cleaning process, a surface 230b (e.g., opposite to the surface 230a) of the encapsulant 230 is lower than a rear surface 210b (e.g., opposite to the front surface 210a) of the die 210 and a rear surface 220b (e.g., opposite to the front surface 220a) of the die 220. In other words, a step height SH is formed between the encapsulant 230 and the die 210 and between the encapsulant 230 and the die 220. The step height SH is in a range of 2 µm to 50 µm, for example.

Figure 5F:
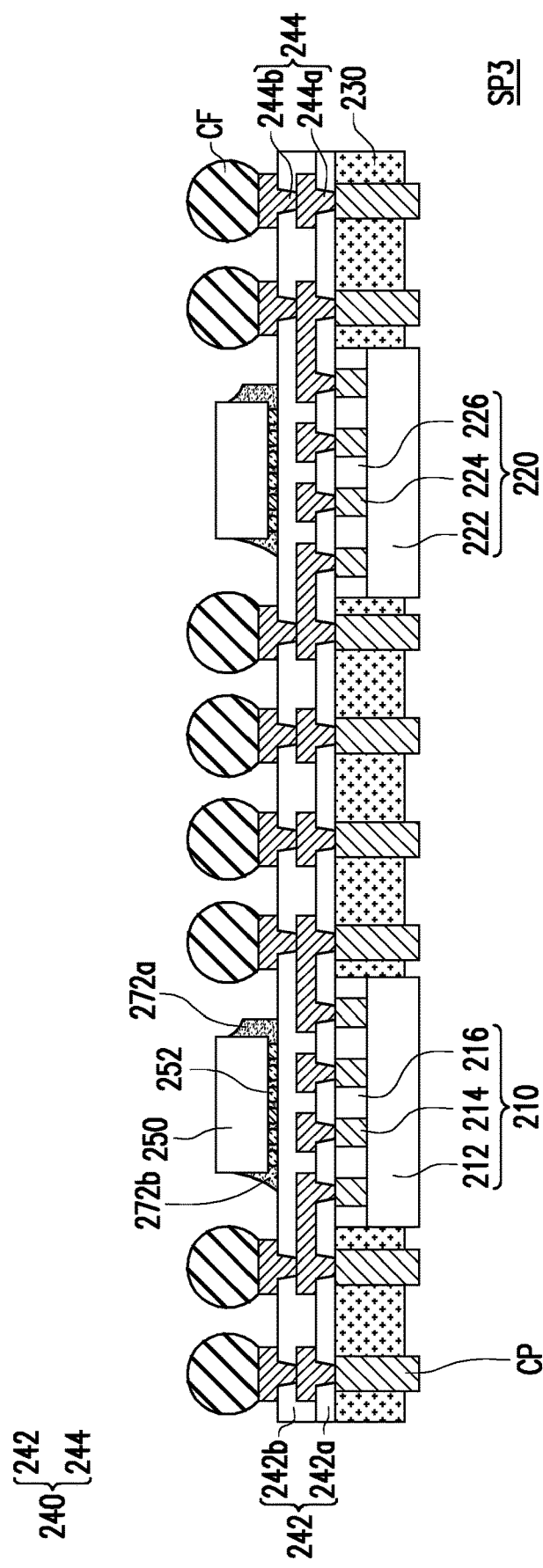

After removing the adhesive layer AD, a singulation process is performed to form a plurality of semiconductor packages SP3 of FIG. 5F. In some embodiments, the singulation process may be similar to the singulation process in FIG. 1J. In some embodiments, the semiconductor package SP3 may be referred to as an integrated fan-out (InFO) package. However, the disclosure is not limited thereto. In some alternative embodiments, the semiconductor package SP3 may be other types of packages.

Figure 7:
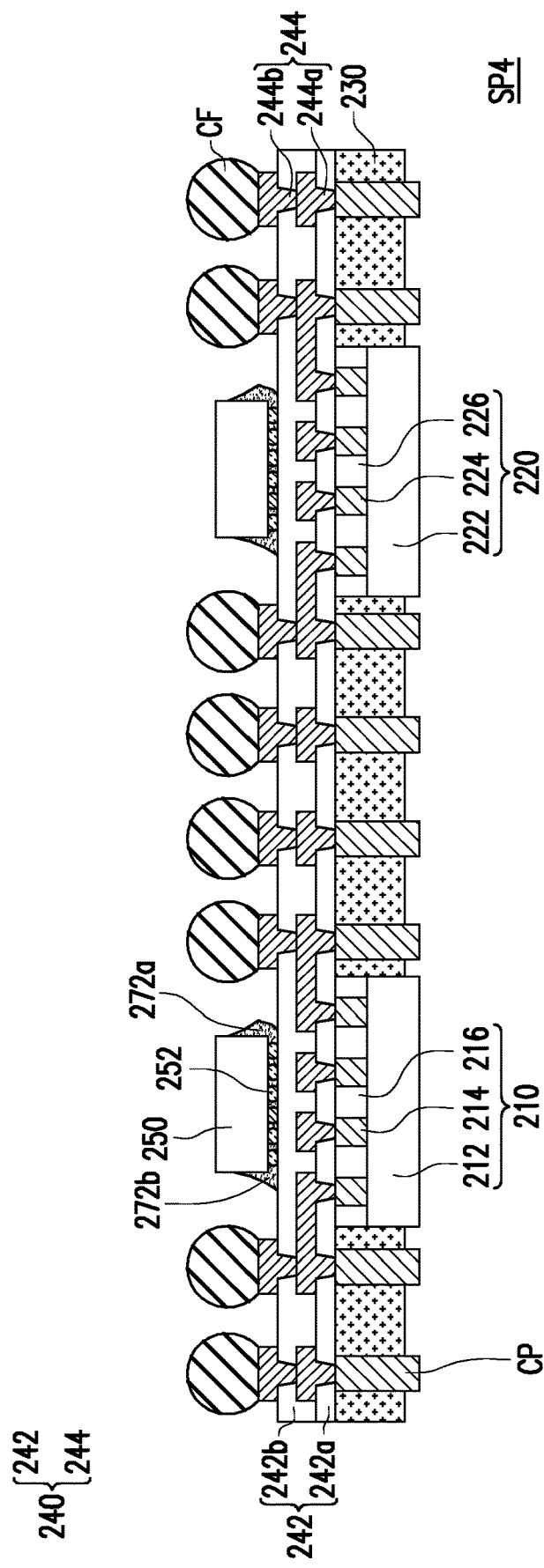
FIG. 7 is a schematic cross-sectional view of a semiconductor package in accordance with some embodiments.
Figure 8:
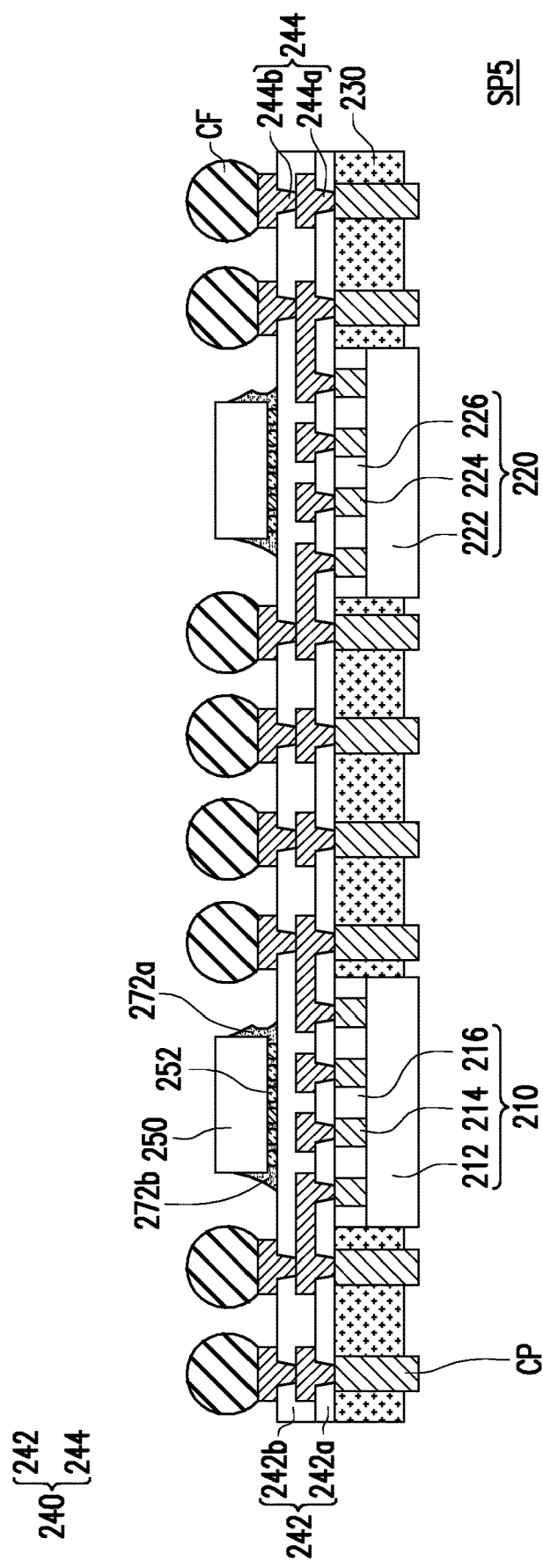
FIG. 8 is a schematic cross-sectional view of a semiconductor package in accordance with some embodiments.

In some alternative embodiments, the underfill fillet 272a at the side 250a may have other configuration according to the shape of the temporary underfill stopper. For example, as shown in FIGS. 7 and 8, in the semiconductor package SP4, SP5, the underfill fillet 272a at the side 250a has a shape similar to the underfill fillet 172a in FIGS. 3C and 4C.

In some embodiments, through the usage of the temporary underfill stopper, the bleeding and damage of the underfill to the conductive features such as BGA may be prevented. Since no bleeding issue is concerned, the dispensing speed may be increased to save the time. Accordingly, the process window for underfill dispensing process is enlarged, and the distance between the die such as IPD and the conductive features such as BGA may be reduced. As such, the size of the semiconductor package may be further reduced. In addition, since the temporary underfill stopper is removed after forming the underfill, no reliability concern should be considered. Moreover, the adhesive layer may be removed by the dry cleaning process, the damage to the conductive features may be prevented. Based on the above, and the product yield may be improved.

In accordance with some embodiments of the disclosure, a semiconductor package includes a die and an underfill. The die is disposed over a surface and includes a first sidewall. The underfill encapsulates the die. The underfill includes a first underfill fillet on the first sidewall, and in a cross-sectional view, a second sidewall of the first underfill fillet has a turning point.

In accordance with some embodiments of the disclosure, a semiconductor package includes a first die and an underfill. The first die is bonded to a surface and includes a first sidewall. The underfill encapsulates the first die and partially exposes the first sidewall. The underfill includes a first underfill fillet on the first sidewall. The first underfill fillet includes a second sidewall. A width between the first sidewall and the second sidewall decreases or remains substantially the same as the first underfill fillet becomes closer to the surface.

In accordance with some embodiments of the disclosure, a method of manufacturing a semiconductor package includes the following steps. A plurality of conductive features are formed aside a first die. A temporary underfill stopper is continuously formed between the first die and portions of the plurality of conductive features along at least one side of the first die. An underfill is filled between the first die and the temporary underfill stopper. The temporary underfill stopper is removed.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a die over a surface, comprising a first sidewall; and
   an underfill encapsulating the die, the underfill comprising a first underfill fillet on the first sidewall, wherein in a cross-sectional view, a second sidewall of the first underfill fillet has a first endpoint on the first sidewall, a second endpoint on the surface and a turning point between the first endpoint and the second endpoint, and a distance between the first sidewall and the turning point or between an extending line of the first sidewall and the turning point is substantially the same as a distance between the second endpoint and the extending line of the first sidewall.

2. The semiconductor package of claim 1, wherein the underfill further comprises a second underfill fillet on a third sidewall opposite to the first sidewall of the die, and a fourth sidewall of the second underfill fillet has no turning point.

3. The semiconductor package of claim 1, wherein the underfill further comprises a second underfill fillet on a third sidewall opposite to the first sidewall of the die, and a fourth sidewall of the second underfill fillet has a turning point.

4. A semiconductor package, comprising:
a first die bonded to a surface, comprising a first sidewall; and
an underfill encapsulating the first die and partially exposing the first sidewall, the underfill comprising a first underfill fillet on the first sidewall, the first underfill fillet comprising a second sidewall, wherein a first portion of the second sidewall is a curve having a single radius of curvature.

5. The semiconductor package of claim 4, further comprising a plurality of conductive features aside the first die, wherein the underfill is disposed between and separated from the die and the conductive features.

6. The semiconductor package of claim 4, further comprising a second die and a third die stacked on the first die, wherein the first die electrically connects the second die and the third die.

7. The semiconductor package of claim 6, further comprising an encapsulant encapsulating the second die and the third die over the first die, wherein a surface of the encapsulant is recessed with respect to surfaces of the second die and the third die.

8. A method of manufacturing a semiconductor package, comprising:
forming a plurality of conductive features aside a first die;
along at least one side of the first die, continuously forming a temporary underfill stopper between the first die and portions of the plurality of conductive features;
filling an underfill between the first die and the temporary underfill stopper; and
removing the temporary underfill stopper, wherein in a cross-sectional view, a sidewall of the underfill has a first endpoint on the first sidewall, a second endpoint on the surface, and a turning point between the first endpoint and the second endpoint, and a distance between the first sidewall and the turning point or between an extending line of the first sidewall and the turning point is substantially the same as a distance between the second endpoint and the extending line of the first sidewall.

9. The method of claim 8, wherein the temporary underfill stopper is formed to surround all sidewalls of the first die.

10. The method of claim 8, wherein at least one side of the first die is not surrounded by the temporary underfill stopper.

11. The method of claim 8, wherein a cross-sectional shape of the temporary underfill stopper comprises a pillar.

12. The method of claim 8, further comprising:
forming a second die and a third die with an adhesive layer therebeneath, wherein the second die and the third die electrically connected by the first die; and
removing the adhesive layer by a dry cleaning process.

13. The semiconductor package of claim 1, wherein a distance between the first sidewall and a point of the second sidewall between the first endpoint and the turning point is smaller than the distance between the second endpoint and the extending line of the first sidewall.

14. The semiconductor package of claim 1, wherein a portion of the second sidewall between the first endpoint and the turning point is substantially linear.

15. The semiconductor package of claim 4, wherein the first portion of the second sidewall is disposed between a second portion of the second sidewall and the surface, and a distance between the second portion of the second sidewall and the first sidewall increases as the second portion of the second sidewall becomes closer to the surface.

16. The semiconductor package of claim 15, wherein a largest distance between the second portion of the second sidewall and the first sidewall is smaller than a largest distance between the first portion of the second sidewall and the first sidewall.

17. The semiconductor package of claim 15, wherein a turning point is disposed between the first portion and the second portion of the second sidewall.

18. The semiconductor package of claim 4, wherein the first portion of the second sidewall is disposed between a second portion of the second sidewall and the surface, and the second portion of the second sidewall is substantially linear.

19. The semiconductor package of claim 4, further comprising an encapsulant encapsulating and being in direct contact with the first die and the underfill, wherein a surface of the encapsulant is substantially flush with a surface of the first die.

20. The semiconductor package of claim 4, further comprising a second die and an encapsulant over the first die, wherein the encapsulant encapsulates the second die and a surface of the encapsulant is recessed with respect to surfaces of the second die.

* * * * *